United States Patent
Ghoshal

(10) Patent No.: US 7,475,551 B2
(45) Date of Patent: Jan. 13, 2009

(54) SYSTEM EMPLOYING TEMPORAL INTEGRATION OF THERMOELECTRIC ACTION

(75) Inventor: Uttam Ghoshal, Austin, TX (US)

(73) Assignee: NanoCoolers, Inc., Austin, TX (US)

( * ) Notice: Subject to any disclaimer, the term of this patent is extended or adjusted under 35 U.S.C. 154(b) by 658 days.

(21) Appl. No.: 11/231,605

(22) Filed: Sep. 21, 2005

(65) Prior Publication Data
US 2006/0137361 A1    Jun. 29, 2006

Related U.S. Application Data

(63) Continuation-in-part of application No. 11/020,355, filed on Dec. 23, 2004, now Pat. No. 7,293,416, and a continuation-in-part of application No. 11/020,529, filed on Dec. 23, 2004, now Pat. No. 7,296,417.

(51) Int. Cl.
F25B 21/02    (2006.01)
(52) U.S. Cl. ............................................. 62/3.2; 62/3.7
(58) Field of Classification Search ................... 62/3.2, 62/3.3, 3.7
See application file for complete search history.

(56) References Cited

U.S. PATENT DOCUMENTS

| | | | |
|---|---|---|---|
| 3,633,217 A | 1/1972 | Lance | |
| 3,654,528 A | 4/1972 | Barkan | |
| 4,065,936 A | 1/1978 | Fenton et al. | |
| 4,177,015 A | 12/1979 | Davidson | |
| 4,306,426 A * | 12/1981 | Berthet et al. ................. | 62/3.2 |
| 4,688,147 A | 8/1987 | Ono | |
| 5,009,399 A | 4/1991 | Bykhovsky et al. | |
| 5,184,211 A | 2/1993 | Fox | |
| 5,640,046 A | 6/1997 | Suzuki et al. | |
| 5,867,990 A | 2/1999 | Ghoshal | |
| 5,943,211 A | 8/1999 | Havey et al. | |
| 5,993,164 A | 11/1999 | Diaz | |
| 6,000,225 A | 12/1999 | Ghoshal | |
| 6,021,844 A | 2/2000 | Batchelder | |
| 6,065,293 A | 5/2000 | Ghoshal | |

(Continued)

FOREIGN PATENT DOCUMENTS

JP    360004244 A    1/1985

(Continued)

OTHER PUBLICATIONS

D.M. Rowe (ed.), CRC Handbook of Thermoelectrics, CRC Press (New York), 1995, pp. 479-488.

(Continued)

*Primary Examiner*—Melvin Jones
(74) *Attorney, Agent, or Firm*—Zagorin O'Brien Graham LLP

(57) ABSTRACT

Active cooling technologies such as thermoelectrics can be used to introduce thermal "gain" into a cooling system and, when employed in combination with forced flow cooling loops, can provide an attractive solution for cooling high heat flux density devices and/or components. In such configurations, it can be advantageous to discontinuously flow thermal transfer fluid into thermal contact with the hot or cold side of a thermoelectric module (TEM), allow it to dwell while heat is transferred from or to the TEM, and resume the flow. In configurations in which the TEM operation is itself discontinuous, various relationships between thermal transfer fluid flow and TEM operation can be advantageously employed to temporally integrate thermoelectric action.

39 Claims, 16 Drawing Sheets

U.S. PATENT DOCUMENTS

| | | | |
|---|---|---|---|
| 6,105,381 A | 8/2000 | Ghoshal | |
| 6,119,463 A | 9/2000 | Bell | |
| 6,146,103 A | 11/2000 | Lee et al. | |
| 6,161,388 A | 12/2000 | Ghoshal | |
| 6,175,495 B1 | 1/2001 | Batchelder | |
| 6,222,113 B1 | 4/2001 | Ghoshal | |
| 6,223,539 B1 | 5/2001 | Bell | |
| 6,227,809 B1 | 5/2001 | Forster et al. | |
| 6,241,480 B1 | 6/2001 | Chu et al. | |
| 6,256,996 B1 | 7/2001 | Ghoshal | |
| 6,266,962 B1 | 7/2001 | Ghoshal | |
| 6,282,907 B1 | 9/2001 | Ghoshal | |
| 6,300,150 B1 | 10/2001 | Venkatasubramanian | |
| 6,338,251 B1 * | 1/2002 | Ghoshal | 62/3.2 |
| 6,384,312 B1 | 5/2002 | Ghoshal | |
| 6,388,185 B1 | 5/2002 | Fleurial et al. | |
| 6,452,740 B1 | 9/2002 | Ghoshal | |
| 6,467,279 B1 | 10/2002 | Backman et al. | |
| 6,474,074 B2 | 11/2002 | Ghoshal | |
| 6,494,048 B1 | 12/2002 | Ghoshal et al. | |
| 6,505,468 B2 | 1/2003 | Venkatasubramanian | |
| 6,588,217 B2 | 7/2003 | Ghoshal | |
| 6,597,544 B2 | 7/2003 | Ghoshal | |
| 6,598,403 B1 | 7/2003 | Ghoshal | |
| 6,598,405 B2 | 7/2003 | Bell | |
| 6,606,866 B2 | 8/2003 | Bell | |
| 6,608,250 B2 | 8/2003 | Ghoshal | |
| 6,613,602 B2 | 9/2003 | Cooper et al. | |
| 6,614,109 B2 | 9/2003 | Cordes et al. | |
| 6,625,990 B2 | 9/2003 | Bell | |
| 6,637,210 B2 | 10/2003 | Bell | |
| 6,658,861 B1 | 12/2003 | Ghoshal et al. | |
| 6,672,076 B2 | 1/2004 | Bell | |
| 6,700,052 B2 | 3/2004 | Bell | |
| 6,708,501 B1 | 3/2004 | Ghoshal et al. | |
| 6,712,258 B2 | 3/2004 | Ghoshal | |
| 6,740,600 B2 | 5/2004 | Ghoshal et al. | |
| 2003/0005706 A1 | 1/2003 | Bell | |
| 2003/0029173 A1 | 2/2003 | Bell | |
| 2003/0079770 A1 | 5/2003 | Bell | |
| 2004/0020217 A1 | 2/2004 | Bell | |
| 2004/0031514 A1 | 2/2004 | Bell | |
| 2004/0234379 A1 | 11/2004 | Miner et al. | |
| 2004/0234392 A1 | 11/2004 | Ghoshal et al. | |
| 2005/0160752 A1 | 7/2005 | Ghoshal et al. | |
| 2006/0137359 A1 | 6/2006 | Ghoshal | |
| 2006/0137360 A1 | 6/2006 | Ghoshal | |

FOREIGN PATENT DOCUMENTS

| | | |
|---|---|---|
| JP | 06188582 A | 7/1994 |
| JP | 07321265 A | 12/1995 |

OTHER PUBLICATIONS

V. Zakordonets and G. Loginov, "Thermoelectric figure of merit of monopolar semiconductors with finite dimensions," Semiconductors, vol. 31, pp. 265-267, Mar. 1997.

S. Tada, R. Echigo, H. Yoshida, "A New Concept of Porous Thermoelectric Module Using a Reciprocating Flow for Cooling / Heating System," 16th International Conference on Thermoelectrics, IEEE, Dresden, DE, pp. 664-667, Aug. 1997.

A. Bejan (ed.), Advanced Engineering Thermodynamics, 2nd Edition, John Wiley & Sons, Inc. (New York), 1997, pp. 675-682.

M. Coey and D. Weaire, "Magnets, Markets and Magic Cylinders," The Industrial Physicist, vol. 4, No. 3, Sep. 1998, pp. 34-36.

M. Bartkowiak and G. Mahan, "Boundary Effects in Thin Film Thermoelectrics," Materials Research Society Symposium Proceedings, vol. 545, pp. 265-272, 1999.

Tellurex Corporation, "Frequently Asked Questions," http://www.tellurex.com, © 2002, printed Dec. 1, 2004.

Tellurex Corporation, "Frequently Asked Questions about Thermoelectric Power Generation," http://www.tellurex.com, © 2003, printed Dec. 1, 2004.

A. Miner and U. Ghoshal, "Cooling of high-power-density microdevices using liquid metal coolants," Appl. Phys. Letters, vol. 85, No. 3, pp. 506-508, Jul. 19, 2004.

* cited by examiner

SYSTEM EMPLOYING TEMPORAL INTEGRATION OF THERMOELECTRIC ACTION

CROSS-REFERENCE TO RELATED APPLICATION(S)

This application is a continuation-in-part of commonly-owned U.S. patent application Ser. No. 11/020,355, entitled "COUNTERFLOW THERMOELECTRIC CONFIGURATION EMPLOYING LIQUID METAL AS THERMAL TRANSFER FLUID," and naming Uttam Ghoshal as inventor, and Ser. No. 11/020,529, entitled "THERMOELECTRIC CONFIGURATION EMPLOYING THERMAL TRANSFER FLUID FLOW(S) WITH RECUPERATOR," and naming Uttam Ghoshal as inventor, each filed 23 Dec. 2004.

BACKGROUND

1. Field of the Invention

The present invention relates to thermal transfer systems, and more particularly, to thermoelectric configurations in which heat trans.

2. Description of the Related Art

Electronic devices such as central processing units, graphic-processing units and laser diodes can generate substantial heat during operation. If such heat is not dissipated properly, temperature buildup may occur and such buildup can adversely affect the performance of these devices. For example, excessive temperature buildup may lead to malfunctioning or breakdown of the devices. Alternatively, stability or performance characteristics may be adversely affected. Accordingly, it is important to remove the generated heat in order to maintain desired operating temperatures of these devices.

In many challenging scientific and commercial cooling applications, particularly microelectronics, cooling of high power dissipation densities (e.g., densities >100 W/cm$^2$) may be required. Worse still, these densities are projected to increase in the future. In general, such applications require cooling beyond what can be offered by conventional finned heat sink structures and forced air cooling. Consequently, alternatives such as single- and two-phase fluid cooling systems are being implemented more widely.

Characteristics such as low vapor pressure and high thermal conductivity make liquid metals attractive for high temperature cooling applications. Commonly-owned U.S. Pat. No. 6,658,861, entitled "Cooling of High Power Density Devices by Electrically Conducting Fluids" describes various exemplary liquid metal cooling configurations. In certain configurations, heat is transferred from a high power density device to the liquid metal, the liquid metal is transported away from the high power density device and heat is distributed and/or dissipated at a convenient distance (e.g., using a heat sink).

In addition to providing excellent heat transfer characteristics, the high electrical conductivity typical in this class of fluids offers the potential of efficient, compact pumping. Accordingly, liquid metals offer an attractive solution for current and future high power density cooling challenges. However, even with all the advantages of efficient forced flow liquid metal cooling, some cooling applications may require greater cooling power than can be achieved simply through simple rejection of heat from the liquid metal to an ambient environment. While ever larger heat sinks and forced air techniques can be employed to improve dissipation to the ambient environment, form factor or other constraints may limit these solutions. For these and other applications, improved techniques are desired.

SUMMARY

Active cooling technologies such as thermoelectrics can be used to introduce thermal "gain" into a cooling system and, when employed in combination with forced flow cooling loops, can provide an attractive solution for cooling high heat flux density devices and/or components. In such configurations, it can be advantageous to discontinuously flow thermal transfer fluid into thermal contact with the hot or cold side of a thermoelectric module (TEM), allow it to dwell while heat is transferred from or to the TEM, and resume the flow. In configurations in which the TEM operation is itself discontinuous, various relationships between thermal transfer fluid flow and TEM operation can be advantageously employed to temporally integrate thermoelectric action.

While exploitations of the present invention include both open and closed loop configurations, aspects of the inventive concepts and techniques described herein will be understood in the context of certain illustrative closed-cycle fluid loop configurations. In some configurations, hot-side and cold-side flows are part of respective and distinct closed loops. In some configurations, hot-side and cold-side flows are parts of a same or unified closed loop. In some configurations, hot-side and cold-side closed loop flows at least partially overlap. In some configurations, thermal transfer fluid may be motivated to flow through the loop configuration by a single electromagnetic pump. In some configurations, thermal transfer fluid may be motivated to flow through the loop configuration by multiple electromagnetic pumps.

Discontinuous flows may provide temporal integration of the action of the thermoelectric modules. Discontinuous flows may be responsive to an operating characteristic of the system. Intermittent flows may have a repetition rate that is predetermined. Thermal transfer fluid dwell times may be predetermined or variable in response to conditions in the thermoelectric system. Total instantaneous current demands of the system may be limited when electromagnetic pumps motivating the flows are operated in phase relationships with the thermoelectric modules, with each other, or with both modules and other pumps.

While embodiments of the present invention are described primarily with respect to cooling configurations, based on the description herein, persons of ordinary skill in the art will appreciate that the described techniques and configurations may be employed or adapted for use in other heat transfer applications including heating and temperature regulation. These and other embodiments and exploitations will be understood with reference to the specification and claims that follow.

BRIEF DESCRIPTION OF THE DRAWINGS

The present invention may be better understood, and its numerous objects, features, and advantages made apparent to those skilled in the art by referencing the accompanying drawings.

FIG. 1A shows a TE element made of a p-type material. FIG. 1B shows the analogous structure of a TE element made of an n-type material.

The use of the same reference symbols in different drawings indicates similar or identical items.

DESCRIPTION OF THE PREFERRED EMBODIMENT(S)

Figure 1A:
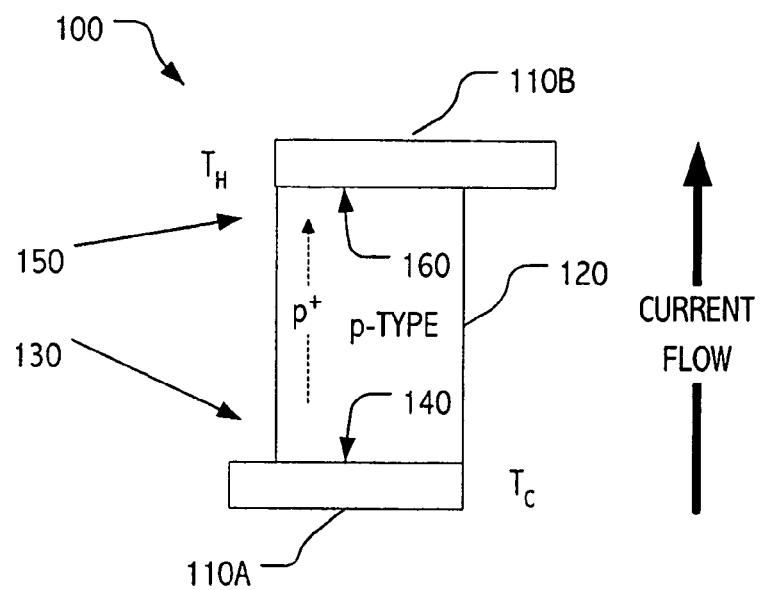
FIGS. 1A and 1B depict individual Peltier-type thermoelectric (TE) elements. In particular.

In the description that follows, we detail systems that employ thermoelectric modules (TEMs) in conjunction with one or more closed fluid cycle loops in which a forced flow of thermal transfer fluid (e.g., a liquid metal thermal transfer fluid) is used to transfer thermal energy to or from the thermoelectric modules. Systems are also described in which some fluid flows do not constitute a closed-cycle. In such systems, it can be advantageous to discontinuously flow the thermal transfer fluid into thermal contact with the hot or cold side of a thermoelectric module, allow it to dwell while heat is transferred from or to the thermoelectric module, and resume the flow. In configurations in which the thermoelectric module operation is itself discontinuous, various relationships between thermal transfer fluid flow and thermoelectric module operation can be advantageously employed to temporally integrate thermoelectric action.

In some thermoelectric systems it may be desirable to limit the temperature differential (ΔT) that develops between the hot and cold sides of a thermoelectric module during its operation. In many thermoelectric systems, limiting ΔT results in improved operating efficiency of the thermoelectric module. In many of the illustrated configurations, discontinuous flows of thermal transfer fluid are employed to limit the ΔT across a thermoelectric module during operation. Arrays of thermoelectric modules may be used to improve performance of thermoelectric systems. In many of the illustrated configurations, discontinuous flows of thermal transfer fluid and counterflow topologies are employed to further provide substantially uniform thermal differentials across respective ones of the thermoelectric modules.

Similarly, recuperation techniques are employed to substantially equilibrate temperatures of thermal transfer fluid flows entering respective portions of the fluid flows, which are thermally coupled to respective hot and cold sides of the thermoelectric modules. Based on the description herein, persons of ordinary skill in the art will recognize that recuperation may be unnecessary in configurations that otherwise limit the increase in ΔT across thermoelectric elements. For example, when the thermal transfer fluid destined for both hot- and cold-side flows is drawn from a common pool or other ambient source, both hot- and cold-side flows will be at substantially the same temperature. In cases in which the heat load is substantially matched to the capacity of a heat exchanger in the system, thermal transfer fluid in a cold-side fluid pathway will absorb sufficient heat from the heat load, such as an electronic device, to return it to ambient temperature, while thermal transfer fluid in a hot-side fluid pathway will be sufficiently cooled during its passage through thermal contact with the heat exchanger to return to an ambient temperature. Modulation of the operation of the thermoelectric module and/or of the flow of thermal transfer fluid may be sufficient to return hot- and cold-side thermal transfer fluid(s) to an ambient temperature before returning to thermal contact with the thermoelectric module.

While the inventive concepts and techniques described herein are general to both array and non-array configurations, for array configurations, such topologies (when employed in conjunction with the recuperator techniques described herein) provide substantially uniform (and low) thermal differentials across thermoelectric modules of an array and allow each of the thermoelectric modules to operate in the desired efficiency regime, while accumulating in the thermal transfer fluid flow the heat transfer contributed by each of the thermoelectric modules. similarly, while the inventive concepts and techniques described herein are general to both recuperated and non-recuperated flow configurations, recuperation may provide an attractive mechanism for at least partially equilibrating the temperatures of thermal transfer fluid volumes destined for hot- and cold-side fluid pathways.

Thermoelectric devices and materials are well-known in the art and a wide variety of configurations, systems and exploitations thereof will be appreciated by those skilled in the art. In general, exploitations include those in which a thermal potential is developed as a consequence of an electromotive force (typically voltage) across an appropriate material, material interface or quantum structure, as well as those in which an electromotive force (typically voltage) results from a thermal potential across an appropriate material, material interface or quantum structure.

Often, exploitations of the first type operate based on the Peltier effect, while exploitations of the second type often operate based on the Seebeck effect. Peltier effects arise at interfaces between dissimilar conductive (or semiconductive)

materials, while Seebeck effects arise in materials where a temperature gradient gives rise to current flow. However, more generally, other effects or actions may be similarly exploited, including related or similar effects (e.g., Thomson, magneto caloric, quantum, tunneling and thermoionic effects) in materials, at material interfaces or as a result of quantum scale confinement. Accordingly, for purposes of the present description, the term "thermoelectric" (e.g., thermoelectric module, couple, element, device, material etc.) is meant in the broadest sense of the term in which thermal potential is traded for electromagnetic potential (or vice versa), and therefore includes those thermoelectric configurations which exploit Peltier or Seebeck effects, as well as those that operate based upon Thomson, quantum tunneling, thermoionic, magneto caloric or other similar effect or combination of effects. That said, for clarity of description, we focus on particular Peltier-type thermoelectric systems; however, based on such description, persons of ordinary skill in the art will appreciate applications of the described inventive concepts to configurations in which other thermoelectric-type effects are employed.

In addition to the range of variation on suitable thermoelectric-type effects, persons of ordinary skill in the art will appreciate (based on the description herein), that various of the techniques and configurations described herein may be employed to provide cooling, heating, heating and cooling and/or thermal regulation. While these and other exploitations may fall within the scope of claims that follow, we believe it is useful to focus on certain illustrative embodiments to provide a clear description. Therefore, we focus our description on exemplary cooling configurations in which the Peltier effect is exploited to provide cooling power. For concreteness, we describe systems in which thermal energy is transported away from a high power density device, such as an operating microprocessor, integrated circuit, laser, etc. using one or more liquid metal thermal transfer fluid loops. Other fluids may be employed and the techniques and configurations described herein may be employed in cooling, heating and/or thermal regulation.

Accordingly, in view of the above and without limitation, we now describe operation of typical Peltier-type devices, analyze efficiency factors for refrigerators and detail techniques and configurations whereby various flow configurations may be employed in a system configured to cool a high-power density device. Based on the exemplary configurations, persons of ordinary skill in the art will appreciate suitable adaptations for other cooling applications as well as for heating and/or thermal regulation exploitations.

Peltier-type Thermoelectric Elements, Couples and Modules

Figure 1B:
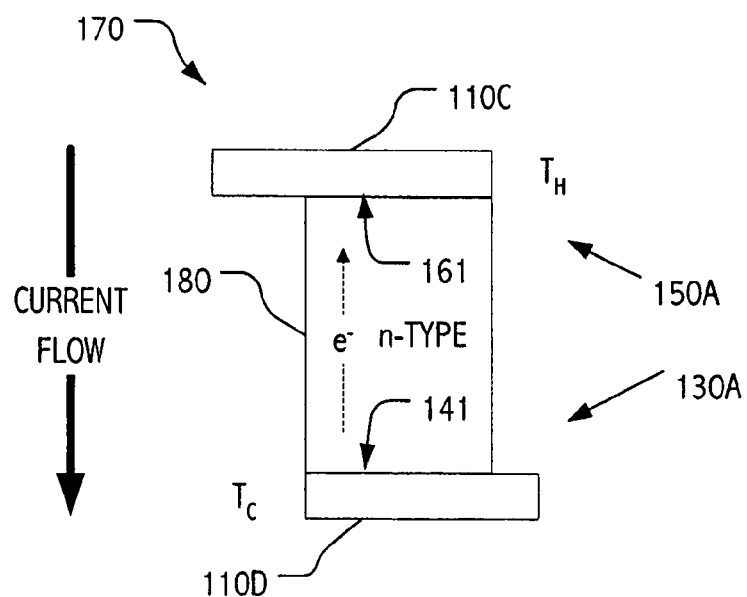

FIGS. 1A and 1B depict individual Peltier-type thermoelectric (TE) elements 100 and 170. In particular, FIG. 1A shows a TE element 100 made of a p-type semiconductor or semimetal material. Current flows from electrical contact 110A through p-type material 120 to electrical contact 110B. Carriers are generated at the cold junction or interface 140 between the electrical contact 110A material and the p-type material 120, absorbing heat at the "cold" end 130 of the TE element. These carriers flow toward the "hot" end 150 of TE element 100 and condense at the hot junction or interface 160, where they release heat. Carriers in p-type materials are positively charged holes, so the current flows from cold end 130 to hot end 150, whence it flows through a second electrical contact 110B to the surrounding electrical circuit.

FIG. 1B shows the analogous structure of a TE element 170 made of an n-type semiconductor or semimetal material. Current flows from electrical contact 110C through n-type material 180 to electrical contact 110D. Carriers are again generated at the cold junction or interface 141 between the electrical contact 110D material and the n-type material 180, absorbing heat at cold end 130 of the TE element. These carriers flow toward hot end 150 of the TE element and condense at the hot junction or interface 161, where they release heat. Carriers in n-type materials are negatively charged electrons, so the direction of current is from hot side 150 to cold side 130.

Figure 2:
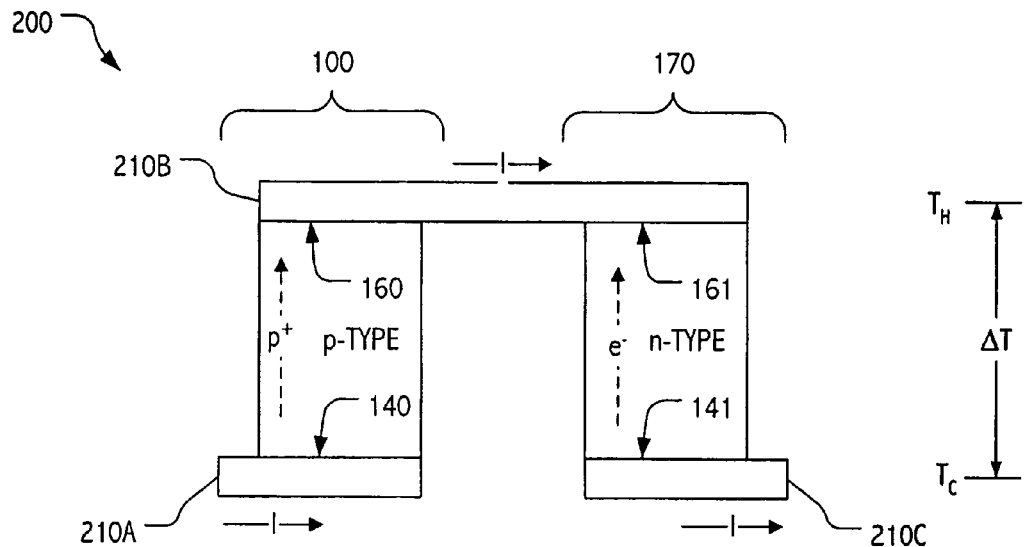
FIG. 2 shows a TE couple formed by arranging two individual complementary TE elements in a configuration in which they are electrically in series and thermally in parallel.

FIG. 2 shows a TE couple 200, formed by arranging two individual complementary TE elements such as TE elements 100 and 170 (above) in a configuration in which they are electrically in series and thermally in parallel. Current flows from an electrical contact 210A at the cold end 130 of TE element 100 through the p-type material 120, through electrical contact 210B at the hot end 150, and through n-type material 180 to electrical contact 210C at the cold end 130 of TE element 170. Carriers (holes) are generated at the cold junction or interface 140 between the electrical contact 210A material and the p-type material 120, absorbing heat. These carriers flow toward the hot end 150 of the TE element 100 and condense at the hot junction or interface 160 between p-type material 120 and electrical contact 210B material, where they release heat. Electrons generated at cold junction or interface 141 flow to the hot junction or interface 161 between the electrical contact 210B material and the n-type material 180, where they condense and release heat.

In both p-type 100 and n-type 170 TE elements, respective carriers are generated at the cold junctions or interfaces (140, 141) and flow toward the hot junctions or interfaces (160, 161) where they condense or recombine. Therefore, by arranging TE elements of alternating carrier type and connecting them in an electrical series configuration, we maintain a single current flow through the TE elements which thermally act in parallel. A temperature difference, $\Delta T$, between hot end and cold end temperatures $T_H$ and $T_C$ is achieved during operation of TE couple 200.

Figure 3:
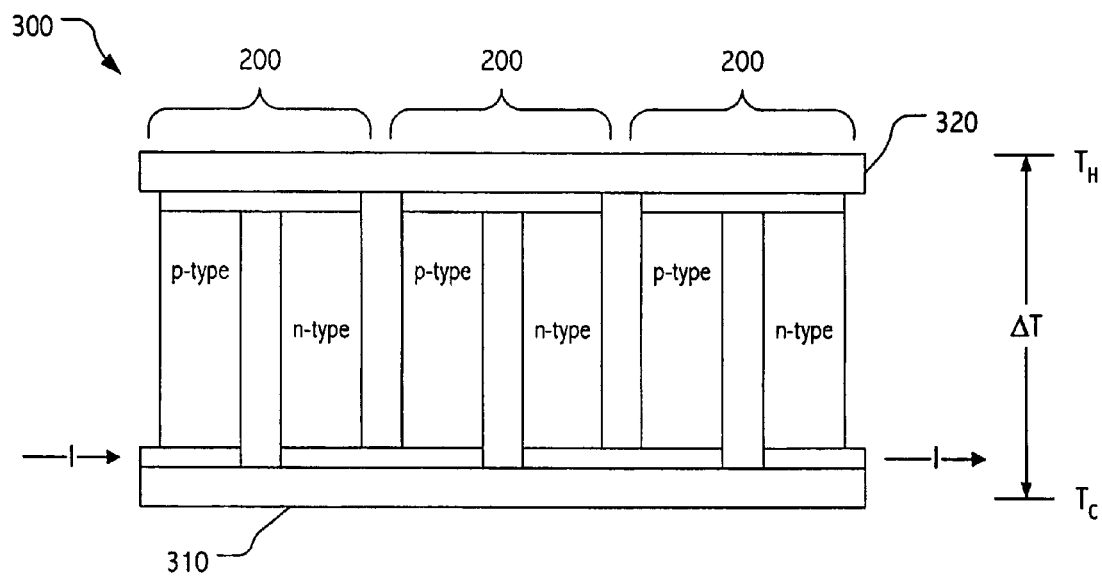
FIG. 3 illustrates a TE module that includes multiple TE couples.

FIG. 3 illustrates a TE module 300 that thermally couples three (3) TE couples 200 that are electrically connected in series. A thermal contact 310 is placed in thermal communication with the cold sides 130 of each of the TE couples 200 to define a substantially isothermal cold end that, during operation, achieve a cold end temperature $T_C$. A similar thermal contact 320 is placed in thermal communication with the hot sides 150 of each of the TE couples 200 to define a substantially isothermal hot end that, during operation, achieve a hot end temperature $T_H$.

Thermal contacts 310 and 320 should be designed or configured to couple thermal energy to/from respective ends of TE couples 200 without shunting electrical current that would otherwise traverse the TE elements. That is, thermal contacts 310 and 320 (together with any intermediate layers at interfaces 311, 321) should act as a thermal conductor and electrical insulator. In general, appropriate materials, layers and/or coating selections are application dependent and persons of ordinary skill in the art will recognize suitable selections for a given application.

While the preceding description has assumed general p-type and n-type semiconductor or semimetal materials, particular materials or material systems are typically employed in configurations that exploit particular thermoelectric-type effects. In general, appropriate material selections are based on the particular thermoelectric-type effects exploited and may be optimized for operating temperatures, compatibility with other materials and other factors. Focusing illustratively on Peltier-type thermoelectrics, devices are commonly fabricated at bulk material scale for use at near room temperatures using semiconductors such as bismuth telluride (BiTe), indium antimony (InSb) and related material systems plated with metal (e.g., Cu) to define the appropriate material interfaces.

As described above, both p-type and n-type materials are employed in practical configurations. A class of materials commonly employed in Peltier-type thermoelectrics is that known as the bismuth chalcogenides. For example, $Bi_{0.5}Sb_{1.5}Te_3$ can be employed as a p-type material and $Bi_2Te_xSe_{3-x}$ as n-type material. Other materials and material systems may be employed depending on design goals, desired operating temperatures and material compatibility issues particular to a given application. In general, the configurations and techniques described herein may be employed with thermoelectric modules of any suitable design and based on any suitable materials or material systems.

While operation of suitable Peltier-type thermoelectric elements, couples and modules will be understood based on the preceding discussion, persons of ordinary skill in the art will recognize that many practical implementations may correspond to the illustrated structures. Neither rectilinear structures nor linear configurations thereof are required. Indeed, many practical configurations include patterned thin or thick film structures fabricated using modern semiconductor processes.

Based on the description herein, persons of ordinary skill in the art will recognize a variety of suitable integrated circuit realizations that generally correspond to the configurations illustrated. Commonly owned, co-pending U.S. patent application Ser. No. 11/020,531, filed Dec. 23, 2004, entitled "MONOLITHIC THIN-FILM THERMOELECTRIC DEVICE INCLUDING COMPLEMENTARY THERMOELECTRIC MATERIALS" and naming Samavedam, Ghoshal, Ngai and Miner as inventors; and Ser. No. 10/756,603, filed Jan. 13, 2004, entitled "THERMOELECTRIC DEVICES" and naming Ghoshal as inventor each describe suitable semiconductor integrated circuit realizations.

Efficiency Analysis

The efficiency of all refrigerators, including Peltier-type thermoelectric coolers, is limited by the second law of thermodynamics which states that it is not possible for the entropy of a system as a whole to decrease as the result of any process. For refrigerators this means that, while one can cool one part of a system and thereby reduce the entropy of that subsystem, the entropy of another part of the system must increase. Practically speaking, it takes energy to cool things below their equilibrium temperature.

Figure 4:
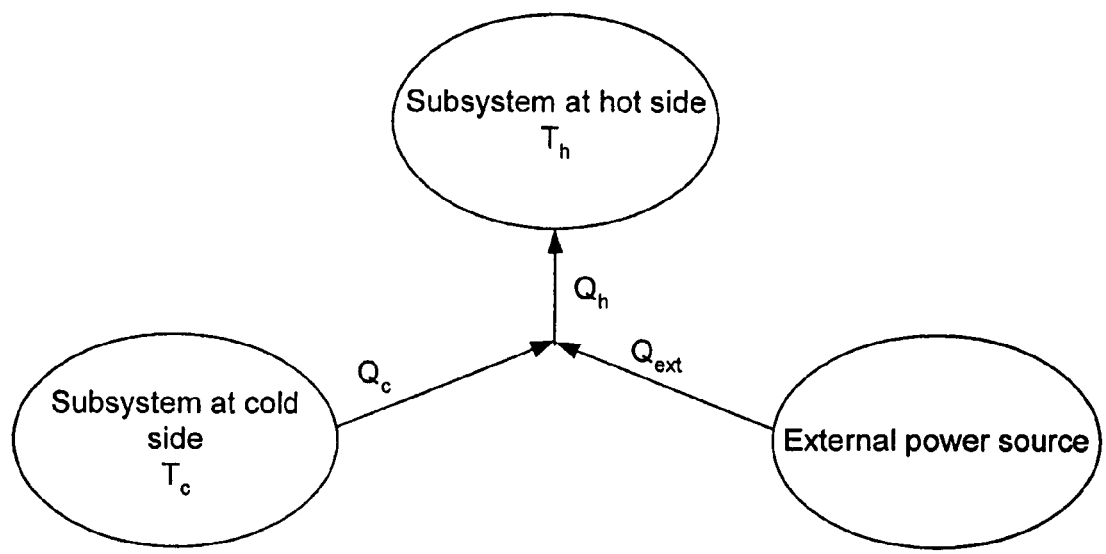
FIG. 4 is a conceptual schematic illustrating the operation of an ideal cooling system, or refrigerator.

FIG. 4 shows a very simple cooling system. From the first law of thermodynamics, the energy of the entire system must remain constant. Therefore, the heat, $Q_h$, dissipated by the system at the hot side of the cooling system at temperature $T_h$ is equal to the sum of the heat, $Q_c$, removed from the cold side at temperature $T_c$ and the energy, $Q_{ext}$, added by an external power source. We can state this alternatively as in Equation 1.

$$Q_{ext} = Q_h - Q_c \quad (1)$$

The efficiency, $\eta_{ref}$, of a cooling system is defined as the cooling power, or the quantity of heat transported away from the item to be cooled ($Q_c$), per unit of power consumed to accomplish the cooling ($Q_{ext}$).

$$\eta_{ref} = \frac{Q_c}{Q_{ext}} \quad (2)$$

In the ideal case of a perfectly reversible cooling process this efficiency is equal to the absolute temperature at the cold side divided by the temperature difference between the hot and cold sides, $\Delta T$, or $$\eta_{ref} = \frac{Q_c}{Q_{ext}} = \frac{T_c}{T_h - T_c} = \frac{T_c}{\Delta T} \quad (3)$$

All real cooling systems are, of course, less efficient than this, but two important points become clear by examining the results for an ideal refrigerator. The first is that as the temperature of the cold side, $T_c$, is reduced the efficiency also drops. The second point is that as the temperature difference between the two sides, $\Delta T$, goes to zero the efficiency of the cooler tends toward infinity. (Of course, as the temperature difference goes to zero no cooling can be accomplished.) In other words, cooling is most efficient when the temperature differential remains small. For both these reasons, refrigerators work less efficiently, that is, they require more energy to operate, as the temperature of the cold side diverges from that of the hot side.

Peltier-type thermoelectric coolers have no moving parts and so are quiet and reliable, requiring little maintenance. They also are small and lightweight, and can be controlled electronically to maintain a precise temperature. Because of these advantages, they are useful in a wide variety of niche applications, especially electronics applications, such as cooling laser diodes and computer electronics. Unfortunately, even with the best materials available today, Peltier coolers have far lower efficiencies than do traditional cooling devices, such as the compressor in a household refrigerator. Therefore, modifying the operation of thermoelectric (TE) coolers to improve their efficiency would be of great benefit and would allow the use of TE coolers and cooling systems in additional applications, including those requiring higher cooling power.

Figure 5:
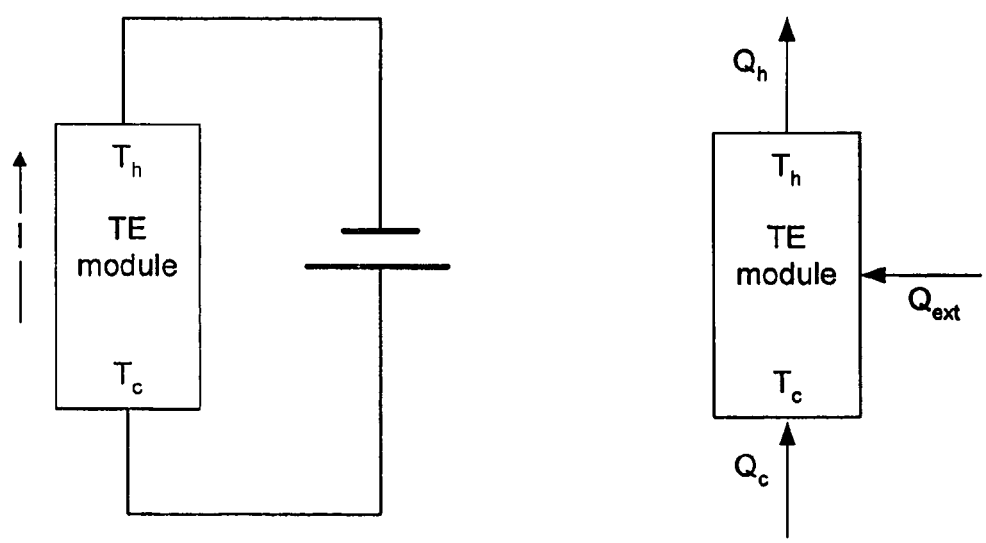
FIG. 5 is a conceptual schematic demonstrating the operating principles of a TE cooling system, with reference to the ideal cooling system of FIG. 4.

FIG. 5 shows a conceptual diagram of a TE cooling element made of a heavily doped semiconductor or semimetal. The left part of the diagram shows the electrical connections while the right part depicts the thermal relationships.

Three processes contribute to the heat flow through a thermoelectric element. First, at each junction heat is generated when a current flows from one material to a dissimilar one. The magnitude of this Peltier effect is proportional to the current, the absolute temperature of the junction, and material-dependent properties. Equations 4 and 5 describe this contribution mathematically.

$$Q_{TE,cold} = ST_c I \quad (4)$$

$$Q_{TE,hot} = ST_h I \quad (5)$$

where the subscripts "hot" and "cold" refer to the side for which the heat flow is being calculated, the subscript "TE" refers to the origin of the heat flow (Peltier or thermoelectric effect), S is the Seebeck coefficient (a property of the TE material), $T_h$ is the temperature at the hot side of the element, $T_c$ is the temperature at the cold side of the element, and I is the current flowing through the electrical circuit.

In the bulk of the TE element, as in any resistive element, Joule heating occurs. Its magnitude is $$Q_{Joule} = I^2 R \quad (6)$$

where the subscript "Joule" refers to the origin of the heat flow (Joule heating), and R is the resistance of the element. Experiments have shown that about half of this heat flows to the cold side and half to the hot side of the element.

Finally, thermal conduction carries heat from hotter to colder regions of the TE element, and its contribution is given by $$Q_{cond,cold} = -\kappa \Delta T \quad (7)$$

$$Q_{cond,hot} = -\kappa \Delta T \quad (8)$$

where the subscript "cond" refers to the origin of the heat flow (thermal conduction) and κ is the thermal conductance of the TE material. Taking the Joule heating contribution at each junction as half the total flow and summing these contributions we get $$Q_h = Q_{TE,hot} + Q_{Joule,hot} + Q_{cond,hot} = ST_h I + \frac{1}{2} I^2 R - \kappa \Delta T \quad (9)$$

$$Q_c = Q_{TE,cold} + Q_{Joule,cold} + Q_{cond,cold} = ST_c I - \frac{1}{2} I^2 R - \kappa \Delta T \quad (10)$$

$$Q_{ext} = Q_h - Q_c = S \Delta T I + I^2 R \quad (11)$$

The efficiency of the cooler is then $$\eta_{ref} = \frac{Q_c}{Q_{ext}} = \frac{ST_c I - \frac{1}{2} I^2 R - \kappa \Delta T}{S \Delta T I + I^2 R} \quad (12)$$

The efficiency of the cooler is a strong function of current, so one can find an optimal current, $I_{opt}$, and calculate the efficiency at that current, $\eta_{max}$, as shown in the following Equations 13 and 14.

$$I_{opt} = \frac{S \Delta T}{R(\sqrt{1 + Z\overline{T}} - 1)} \quad (13)$$

$$\eta_{max} = \left[\frac{T_c}{\Delta T}\right] \cdot \left[\frac{\sqrt{1 + Z\overline{T}} - T_h/T_c}{\sqrt{1 + Z\overline{T}} + 1}\right] \quad (14)$$

where $\overline{T} = \frac{1}{2}(T_h + T_c)$ is the mean, or average, temperature of the TE element, $$Z = \frac{S^2}{\kappa R},$$

and $Z\overline{T}$ is a dimensionless figure of merit for thermoelectric materials, with higher values of $Z\overline{T}$ yielding higher efficiency coolers.

From Equation 14 it is clear that efficiency can be improved by increasing $Z\overline{T}$ and reducing ΔT, the temperature difference between the hot and cold sides of the TE element. Near room temperature, where Peltier coolers are often operated, and for values of $Z\overline{T}$ typical of TE cooler materials, a reduction in ΔT increases the efficiency more rapidly than an increase in $Z\overline{T}$ of the same magnitude. Furthermore, materials used in thermoelectric coolers have a fairly narrow range of $Z\overline{T}$ over their effective operating range and, while the search for better materials continues, it is currently more practical to adjust the temperature difference to improve efficiency.

While low ΔT across an individual thermoelectric element or modules is a figure of merit for cooling (or heating) applications, to provide appropriate magnitudes of cooling power, it can be desirable to configure large arrays coolers (e.g., thermoelectric elements, typically as arrays of thermoelectric modules) in a way that accumulates the cooling power contributions of the individual elements (or modules). In doing so, it becomes important to design a system in which each of the thermoelectric elements (or modules) operates in a desired efficiency regime. Below, we describe a variety of loop configurations in which we can achieve uniformly low ΔT across each of the thermoelectric elements (or modules) of an array.

While the preceding discussion of efficiency has focused on refrigerators, persons of ordinary skill in the art will recognize that the desirability of maintaining a low and generally uniform ΔT across each of the elements or modules of an array applies similarly to heat pumps. Accordingly, while we focus illustratively of arrays of thermoelectric coolers and recuperated, counterflow closed-cycle fluid loop configurations, persons of ordinary skill in the art will appreciate applications and exploitations to heating, heating/cooling and/or temperature regulation applications. In view of the above, and without limitation, we now describe certain exemplary configurations.

Loop Configurations

We now describe a variety of configurations in which arrays of thermoelectric modules are employed in conjunction with one or more closed cycle fluid loops. In the illustrated configurations, closed cycle fluid paths are illustrated. However, more generally in some of the illustrated configurations, at least one fluid path may be configured as an open loop. In general, forced flow of thermal transfer fluid is used to transfer thermal energy to or from the thermoelectric modules. In some configurations, the thermal transfer fluid is a liquid metal or other conductive fluid or slurry and flow is motivated using a magnetofluiddynamic (MFD) pump.

In some cooling (or heating) configurations, a recuperator is employed to limit the magnitude of thermal differential (ΔT) across any given thermoelectric module and thereby improve efficiency. In some configurations, arrays of thermoelectric modules are provided and topologies of the thermal transfer fluid flows are designed to provide substantially uniform and low thermal differentials across respective ones of the thermoelectric modules. In cooling or heating array configurations, such topologies provide allow each of the thermoelectric modules to operate in a desired efficiency regime, while accumulating in the thermal transfer fluid flow the heat transfer contributed by each of the thermoelectric modules. Of course, persons of ordinary skill in the art will recognize that in thermoelectric configurations that employ a single thermoelectric element or module (or in those realizations which the uniform ΔT benefits of a counterflow topology may be forgone), flows topologies need not constitute counterflows.

For clarity of illustration, the thermoelectric array configurations and loop topologies of FIGS. 6A, 6B, 7A, 7B, 8 and 11 are presented in a linear form which will facilitate understanding of the counterflows. However, based on the description herein, persons of ordinary skill in the art will recognize that more complex topologies, including serpentine topologies and crossbows in multidimensional arrays, are also contemplated. Such topological generalizations will be better understood based on description that follows; however, we begin our description with simpler linear presentations as follows.

Figure 6A:
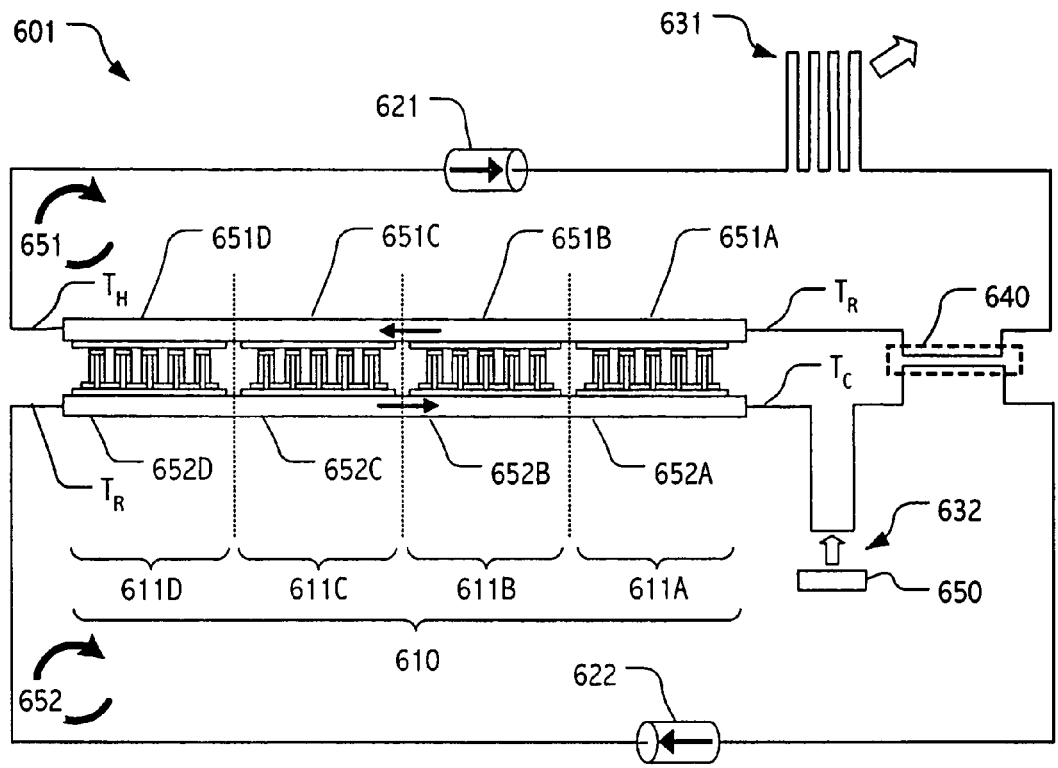
FIG. 6A depicts a counterflow thermoelectric cooler configuration in accordance with some embodiments of the present invention in which two distinct closed-cycle thermal transfer fluid loops are provided.

FIG. 6A depicts an exemplary counterflow thermoelectric cooler configuration 601 in which two distinct thermal transfer fluid loops are provided. A first loop 651 includes respective portions 651A, 651B, 651C and 651D in thermal communication with hot ends of respective thermoelectric modules 611A, 611B, 611C and 611D. Flow of thermal transfer fluid through loop 651 is motivated by pump 621. Similarly, a second loop 652 includes respective portions 652D, 652C, 652B and 652A in thermal communication with cold ends of respective thermoelectric modules 611D, 611C, 611B and 611A. Flow of thermal transfer fluid through loop 652 is motivated by pump 622.

For purposes of illustration, we assume that thermal transfer fluid(s) in either or both of loops 651 and 652 is (are) a liquid metal or other conductive fluid or slurry and that pumps 621 and/or 622 include(s) electromagnetic pumps, such as a magnetofluiddynamic pump described elsewhere herein. In some realizations, the thermal transfer fluid is an alloy of gallium and indium. However, persons of ordinary skill in the art will recognize that other thermal transfer fluids and/or pump configurations may be employed in other realizations.

In the illustrated cooling configuration, heat is transferred from hot ends of respective thermoelectric modules to the liquid metal thermal transfer fluid flow in loop 651. Liquid metal thermal transfer fluid enters portion 651A of the closed cycle fluid loop 651 at a temperature $T_R$. As the fluid flows through portions 651A, 651B, 651C and 651D of loop 651, heat is transferred from hot end ends of respective thermoelectric modules and the fluid exits portion 651D at a temperature $T_H$. From there, the liquid metal thermal transfer fluid flows past or through heat exchanger 631, giving up thermal energy and returning to reenter portion 651A of loop 651, completing the closed cycle fluid loop. Operation of recuperator 640 will be described below.

Figure 6B:
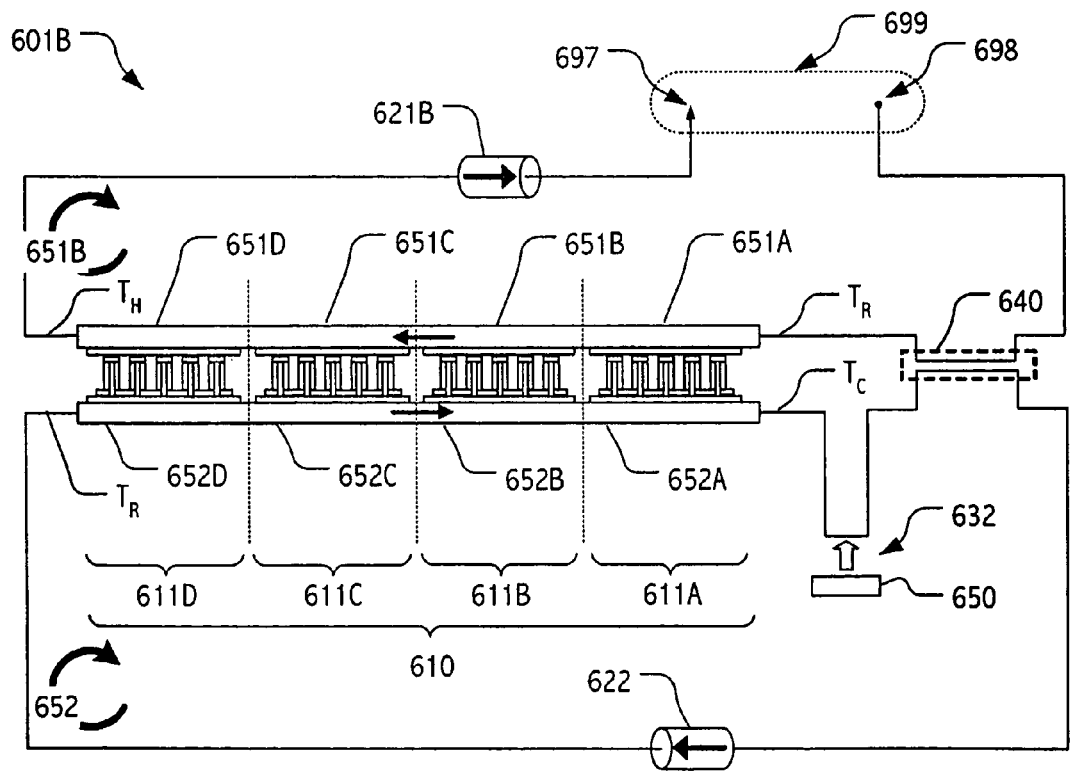
FIG. 6B depicts an alternative configuration in which an open cycle flow is provided.

FIG. 6B illustrates a variation 601B in which fluid path 651B is instead configured as an open cycle pathway. Flow in fluid path 651B is from a source 698 to a sink 697. In some configurations, e.g., those in which source and sink draw from and return to a body 699 of sufficient thermal mass, source 698 and sink 697 may originate from and terminate in a same pool of thermal transfer fluid. However, more generally, there need not be any common body relationship between source 698 and sink 697. Configurations in accordance with FIG. 6B typically employ a thermal transfer fluid other than a liquid metal and suitable pump 621B configurations will, in general, depend on characteristics of the thermal transfer fluid employed in fluid path 651B. Since fluid path 651B no longer constitutes a closed-loop, heat exchanger 631 (see FIG. 6A) is omitted.

Referring again to FIG. 6A and turning now to the cold-side flow of thermoelectric cooler configuration 601, liquid metal thermal transfer fluid exits portion 652A of closed cycle fluid loop 652 at a temperature $T_C$, flowing past or through heat exchanger 632 and picking up thermal energy from the cooled workpiece 650, typically a microprocessor, communications integrated circuit, optoelectronic device or array, laser or high power density device. Flow continues through recuperator 640, which will be described below, and back to thermoelectric array 610. Liquid metal thermal transfer fluid enters portion 652D of the closed cycle fluid loop 652 at a temperature $T_R$. As the fluid flows through portions 651A, 651B, 651C and 651D of loop 651, heat is transferred from the fluid to cold ends of respective thermoelectric modules and the fluid eventually exits portion 651D at a temperature $T_H$, completing the closed cycle fluid loop.

In general, heat exchangers 631 and 632 are any form of heat exchanger appropriate for a particular exploitation of the described counterflow thermoelectric cooler configuration. For example, in some realizations, heat exchanger 631 is an ambient air heat exchanger (e.g., including a finned heat sink and optionally a forced blower or fan) at some distance from the thermoelectric modules. In some realizations, heat exchanger 632 is a solid-fluid heat exchanger including a thermally conductive surface in close thermal communication with cooled workpiece 650 together with a housing through which the liquid metal thermal transfer fluid may flow. For processor chip cooling applications, the thermally conductive surface may be a thin-film tungsten, nickel layer on the backside of the processor or a discrete surface of tungsten, nickel, anodized aluminum or nickel-coated aluminum soldered to the backside of the chip. Suitable housing materials generally include inert polymers (Teflon, polyurethane, etc.), glass or thermally conductive material such as tungsten, nickel, nickel-coated aluminum, anodized aluminum, nickel-coated copper etc.

Recuperator 640 includes a fluid-fluid heat exchanger that substantially equilibrates temperatures (at $T_R$) of thermal transfer fluid flows entering respective portions 651A and 652D of loops 651 and 652. In general, any of a variety of thermally conductive surfaces such as such as tungsten, nickel, nickel-coated aluminum, anodized aluminum, nickel-coated copper, etc. may be employed. By employing recuperator 640, the illustrated thermoelectric cooler configuration 601, ensures a relatively low thermal differential ($\Delta T$) across any given thermoelectric module.

As described above with reference to efficiency analysis, reduction of $\Delta T$ can allow individual Peltier-type thermoelectric elements of the illustrated TE modules to operate (when employed in a thermoelectric cooling or heating configuration) at efficiencies approaching ideal efficiencies for the particular material systems and devices employed.

Similarly, while high power density devices (HPDDs) may constitute the substantial source of thermal differential between hot-side and cold-side flows in certain of the illustrated configurations, in other exploitations, a cooling or heating target need not include a HPDD. Indeed, heat-pump and refrigeration configurations are contemplated in which a thermal source need not constitute an HPDD.

Figure 6C:
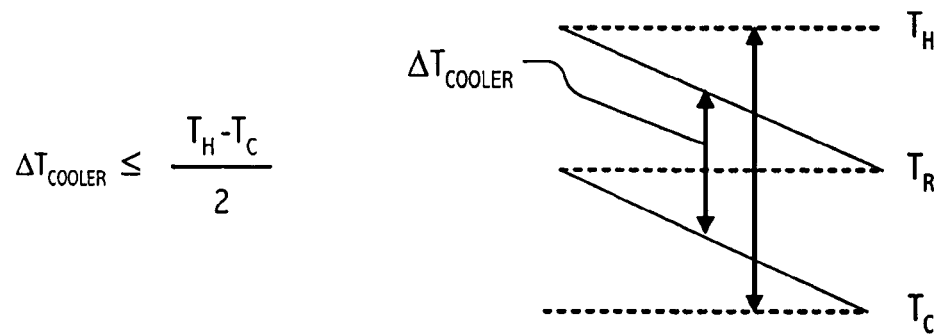
FIGS. 6C and 6D illustrate thermal differentials.
Figure 6D:
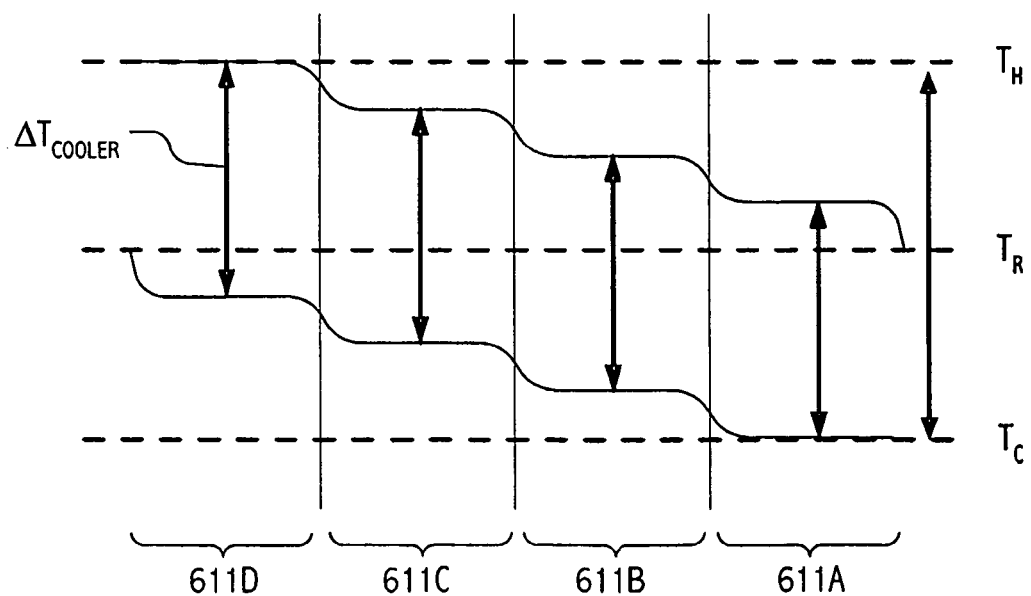

FIG. 6C is a simplified dimensionless depiction of the effect of the illustrated recuperated counterflows on temperature of the thermal transfer fluid flows and thermal differential ($\Delta T$) across any given thermoelectric module or element. While FIG. 6C tends to ignore generally isothermal hot- and cold-end temperatures of a multi-element thermoelectric module configured as illustrated in FIG. 3, FIG. 6D provides a more detailed illustration in relation to thermal differentials across thermoelectric modules 611D, 611C, 611B and 611A. In each case, the use of counterflows provides a generally uniform thermal differential ($\Delta T$) across the thermoelectric modules and inclusion of recuperator 640 tends to minimize magnitude of that generally uniform $\Delta T$.

As previously discussed, any of a variety of thermal transfer fluids and/or pump configurations may be employed in other realizations of the closed-cycle counterflows of FIG. 6A. However, electrically conductive thermal transfer fluids are attractive in that they allow the direct use of magnetofluiddynamic- (MFD-) type electromagnetic pumps. MFD pumps are often more reliable than other kinds of pumps since MFD pumps typically do not have moving parts (except, of course, the conductive fluid itself) and may offer certain system advantages since typical MFD pump configurations are orientation-independent and vibration insensitive.

In general, suitable designs for pumps 621 and 622 include MFD pump designs that include a chamber or path through which a conductive fluid may flow, a fluid inlet, and a fluid outlet. Operation of such an MFD pump will be understood as follows. A magnetic field is created within at least a portion of the chamber path, oriented in a direction generally perpendicular to the desired direction of fluid flow. Respective electrodes are disposed on generally opposing sides of the chamber or path such that a current flowing through the conductive fluid between the electrodes flows in a direction that is generally perpendicular to both the magnetic field and the desired direction of fluid flow.

While any of a variety of MFD pump designs may be employed and particular MFD pump configurations will, in general, be selected based on application specific factors, details of several suitable designs are described in co-pending U.S. application Ser. No. 11/020,530, filed Dec. 23, 2004, entitled "Integrated Electromagnetic Pump and Power Supply Module" and naming Uttam Ghoshal, Key Kolle, and Andrew Carl Miner as inventors, the disclosure of which is hereby incorporated by reference in its entirety.

Turning now to thermal transfer fluid formulations, any of a variety of formulations may be employed in realizations of the closed-cycle flows of FIGS. 6A, 6B, 7A, 7B, 8, 9 and 11. Nonetheless, certain liquid metal formulations are attractive for realizations such as described herein. In particular, alloys of gallium and indium can be employed. Compositions ranging from 65 to 75% (by mass) gallium and 20 to 25% (by mass) indium are generally suitable and materials such as tin, copper, zinc and bismuth may also be present in small percentages. One such composition for a suitable liquid metal thermal transfer fluid is 66% gallium, 20% indium, 11% tin, 1% copper, 1% zinc and 1% bismuth.

While an appropriate thermal transfer fluid selection will, in general, vary from application to application, GaIn alloys are often suitable for configurations such as described herein, in part because, such alloys tend to perform well over a wide range of temperatures with high thermal and electrical conductivities. Melting points ranging from −15° C. to 30° C. can often be achieved and typical GaIn alloys do not form vapor even at temperatures up to 2000° C. Such alloys are typically non-toxic, are relatively cheap and are inert to polyimides, polycarbonates, glass, alumina, Teflon, and conducting metals such as tungsten, molybdenum, and nickel. As a result, such materials can be used in forming the closed-cycle fluid loops 651 and 652.

It will be apparent to those skilled in the art, that a number of other thermal transfer fluids, including other liquid metals may be employed. For example, liquid metals having high thermal conductivity, high electrical conductivity and high volumetric heat capacity can be used. Some examples of liquid metals that can be used in an embodiment of the invention include mercury, gallium, sodium potassium eutectic alloy (78% sodium, 22% potassium by mass), bismuth tin alloy (58% bismuth, 42% tin by mass), bismuth lead alloy (55% bismuth, 45% lead) etc. Bismuth based alloys are generally used at high temperatures (40 to 140° C.). Pure indiumn can be used at temperatures above 156° C. (i.e., the melting point of indium).

In the configurations of FIGS. 6A and 6B, placements of pumps 621, 622 and 621B are illustrative. In general, any of a variety of placements may be suitable. Typically, form factor, power supply proximity, EMI, thermal compatibility and other factors specific to a particular design will suggest an appropriate placement.

Figure 7A:
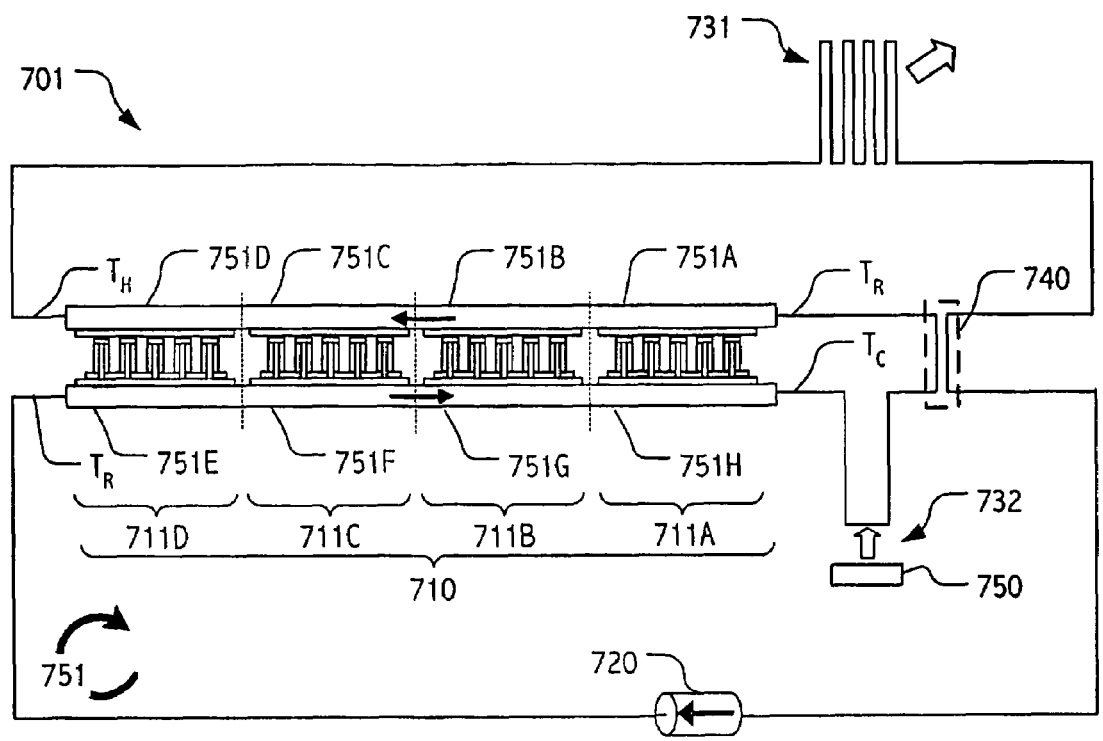
FIG. 7A depicts a counterflow thermoelectric cooler configuration in accordance with some embodiments of the present invention in which a single closed-cycle thermal transfer fluid loop is provided.

FIG. 7A depicts a counterflow thermoelectric cooler configuration 701 in which a single closed-cycle thermal transfer fluid loop traverses both hot- and cold-sides of a thermoelectric array. For economy of description, structures and configurations that are identical, common with or generally similar to those described with reference to a previously described configuration (or suitable for inclusion therein) are not again described with reference to FIG. 7A. Instead, we highlight the major structural and/or operational changes.

In the illustrated configuration, a single closed-cycle thermal transfer fluid loop traverses both hot- and cold-sides of a thermoelectric array. As a result, the configuration allows thermal transfer fluid motivation using a single pump, such as pump 720. As before, we assume that the thermal transfer fluid in loop 751 is a liquid metal or other conductive fluid or slurry and that pump 720 includes an electromagnetic pump, such as a magnetofluiddynamic pump described elsewhere herein. In some realizations, the thermal transfer fluid is an alloy of gallium and indium. However, as before, persons of ordinary skill in the art will recognize that other thermal transfer fluids and/or pump configurations may be employed in other realizations.

Referring to FIG. 7A, a closed-cycle fluid loop 751 includes portions 751A, 751B, 751C and 751D in thermal communication with hot ends and portions 751E, 751F, 751G and 751H in thermal communication with cold ends of respective thermoelectric modules 711A, 711B, 711C and 711D. In the illustrated cooling configuration, heat is transferred from hot ends of respective thermoelectric modules to the liquid metal thermal transfer fluid flow in the closed-cycle fluid loop. Liquid metal thermal transfer fluid enters portion 751A of the closed cycle fluid loop 751 at a temperature $T_R$. As the fluid flows through portions 751A, 751B, 751C and 751D, heat is transferred from hot end ends of respective thermoelectric modules and the fluid exits portion 751D at a temperature $T_H$. From there, the liquid metal thermal transfer fluid flows past or through heat exchanger 731, giving up thermal energy and eventually arriving at the cold-side portion of closed-cycle loop 751.

After passing through recuperator 740, liquid metal thermal transfer fluid enters portion 751E at a temperature $T_R$. As the fluid flows through portions 751E, 751F, 751G and 751H of loop 751, heat is transferred from the fluid to cold ends of respective thermoelectric modules 711D, 711C, 711B and 711A. Liquid metal thermal transfer fluid exits portion 751H of loop 751 at a temperature $T_C$, flowing past or through heat exchanger 732 and picking up thermal energy from the cooled workpiece 750, typically a microprocessor, communications integrated circuit, optoelectronic device or array, laser or high power density device. Flow continues through recuperator 740, and back to thermoelectric array 710. After passing through recuperator 740, liquid metal thermal transfer fluid reenters portion 751A of loop 751 at a temperature $T_R$, thereby completing the closed cycle.

In the illustrated configuration, flow of thermal transfer fluid through loop 751 is motivated by a single pump 720. As before, placement of pump 720 is merely illustrative. In general, any of a variety of placements may be suitable. Typically, form factor, power supply proximity, EMI, thermal compatibility and other factors specific to a particular design will suggest an appropriate placement. Of course, multiple pumps may be employed if desired and a complete system may include multiple closed-cycle fluid loops without departing from the general design principals illustrated in FIG. 7A. For example, multiple stages of cooling, heating or thermal transfer may be provided each with at least one respective closed cycle fluid loop. Also, multiple instances of a configuration such as illustrated in FIG. 7A may be arranged in parallel such that each includes a single closed-cycle thermal transfer fluid loop traverses both hot- and cold-sides of its respective thermoelectric array. These and other variations will be understood in the context of the appended claims.

Figure 7B:
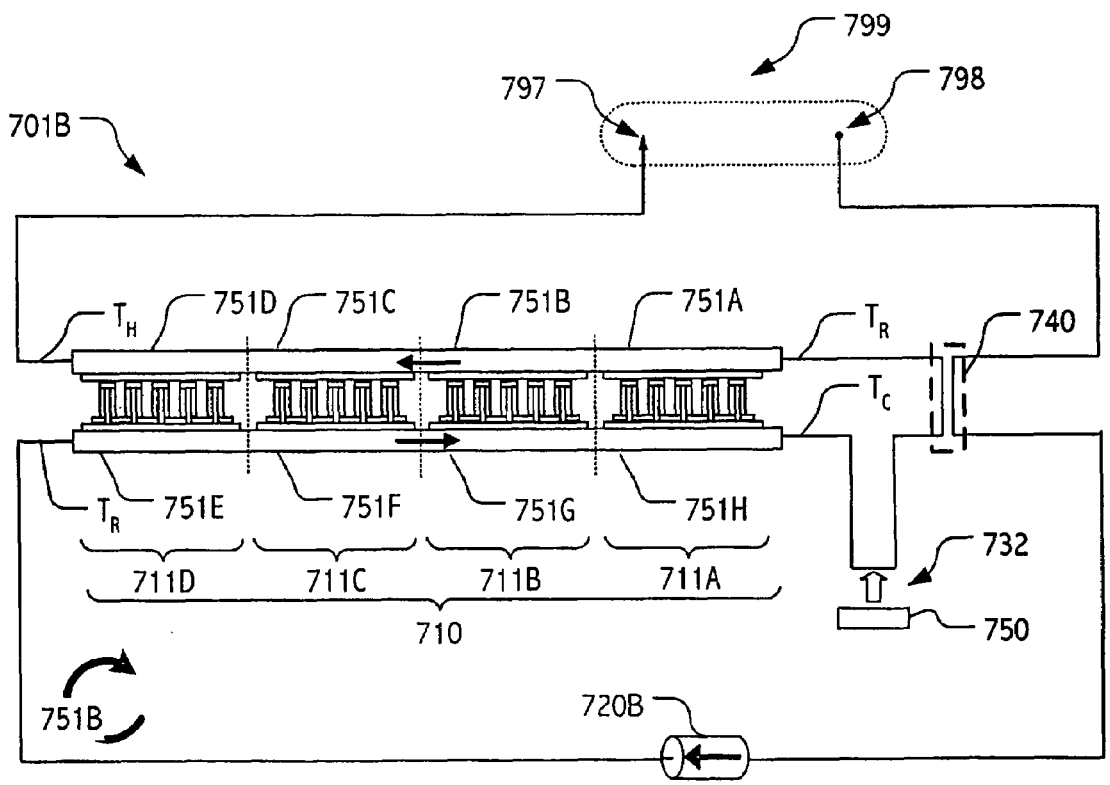
FIG. 7B depicts an alternative configuration in which an open cycle flow is provided.

FIG. 7B illustrates an alternative configuration 701B in which fluid path 751B is instead configured as an open cycle pathway. Flow in fluid path 751B is from a source 798 to a sink 797. As before, in those configurations in which source and sink draw from and return to a body 799 of sufficient thermal mass, source 698 and sink 697 may originate from and terminate in a same pool of thermal transfer fluid. However, more generally, there need not be any common body relationship between source 798 and sink 797. Configurations in accordance with FIG. 7B typically employ a thermal transfer fluid other than a liquid metal and suitable pump 720B configurations will, in general, depend on characteristics of the fluid path 751B thermal transfer fluid. Since fluid path 751B no longer constitutes a closed-loop, heat exchanger 731 (see FIG. 7A) is omitted.

Figure 8:
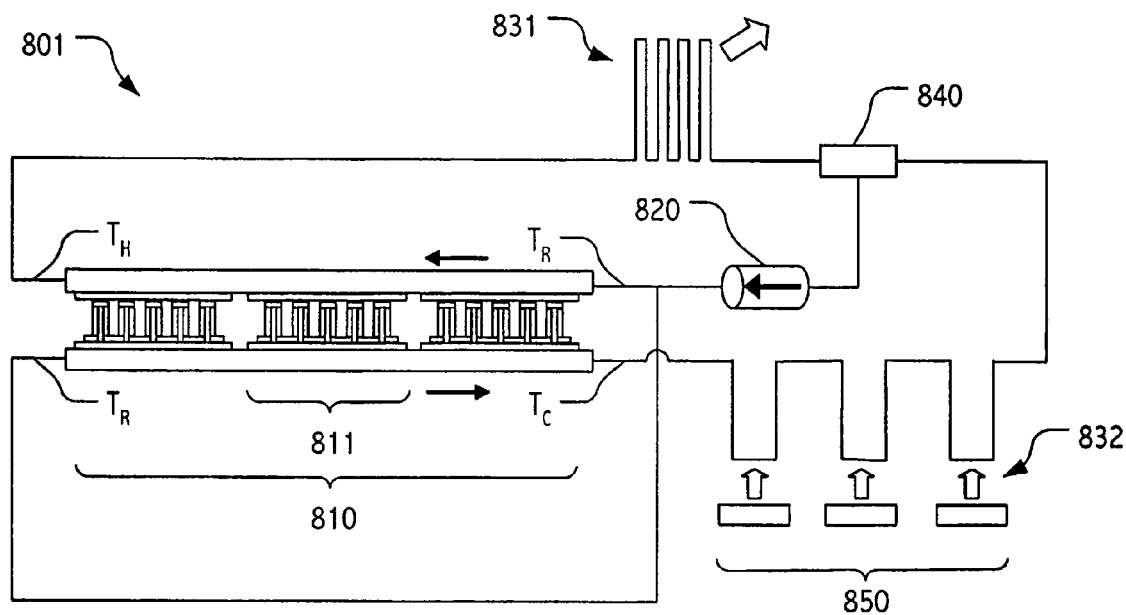
FIG. 8 depicts a counterflow thermoelectric cooler configuration in accordance with some embodiments of the present invention in which hot-side and cold-side flows through a closed-cycle thermal transfer system are commingled.

FIG. 8 depicts another variation in which hot-side and cold-side flows through a closed-cycle thermal transfer system are commingled. As before, structures and configurations that are identical, common with or generally similar to those described with reference to a previously described configuration (or suitable for inclusion therein) are not again described with reference to FIG. 8.

In the illustrated configuration, a closed-cycle flow of thermal transfer fluid path traverses both hot- and cold-sides of a thermoelectric array. As with the prior configuration, a single pump can suffice to motivate flow of the thermal transfer fluid. However, unlike the prior configuration, the motivated flow is split for hot- and cold-side portions of the closed-cycle fluid path and rejoined after flow past a respective heat exchanger (e.g., heat exchanger 831 for flow exiting the hot side portion and heat exchangers 832 for flow exiting the cold side portion).

In the illustrated configuration, rejoining occurs at recuperator 840 in which flows from the hot- and cold-side portions are commingled. Generally, a simple pool recuperator may be employed in which thermal transfer fluid flows of dissimilar temperatures enter, conductive and/or convective heat transfer occurs, and one or more fluid flows exit at (or about) a recuperated mean temperature, $T_R$. However, given the heat transfer characteristics of liquid metal thermal transfer fluids, a simple commingling of flows thereof (e.g., in the flow path that includes pump 820) may exchange heat adequately to achieve a resulting $T_R$ flow without substantial localized thermal variations. As a result in some realizations, recuperative heat transfer may devolve to that achievable in a commingled flow portion of the closed-cycle fluid path (with or without flow path structures to accentuate mixing or turbulent flow). In such cases, the distinct pool illustrated as recuperator 840 may be unnecessary and may be omitted. In such configurations, the commingled flow portion constitutes the recuperator. Of course, if a distinct recuperator is provided, rejoining of flows could occur before entry to any such recuperator. In such case, fluid flowing from hot and cold sides of thermoelectric array 801 would be at least partially mixed even prior to entry and such a recuperator could be configured to damp out any remaining localized thermal variations. These and other variations will be appreciated by persons of ordinary skill in the art.

Referring then to FIG. 8, a closed-cycle fluid loop includes hot-side portions in thermal communication with hot ends of respective thermoelectric modules (such as TE module 811) and cold-side portions in thermal communication with cold ends of respective thermoelectric modules. In the illustrated cooling configuration, liquid metal thermal transfer fluid enters both hot-side and cold-side portions of the closed cycle fluid loop at a temperature $T_R$. As fluid flows through hot-side portions, heat is transferred from hot ends of respective thermoelectric modules and the fluid exits at a temperature $T_H$. From there, the liquid metal thermal transfer fluid flows past or through heat exchanger 831, giving up thermal energy and eventually rejoining flow from the cold-side portion of the closed-cycle fluid path. As fluid flows through cold-side portions, heat is transferred from the fluid to cold ends of respective thermoelectric modules and the fluid exits at a temperature $T_C$, flowing past or through heat exchangers 832 and picking up thermal energy from the cooled workpieces 850. Depiction of multiple work pieces 850 in a series flow configuration is purely illustrative. Single workpiece and other multiple workpiece flow topologies are envisioned in this and other ones of the illustrated thermoelectric loop configurations. In the particular configuration of FIG. 8, flow eventually rejoins that from the hot-side portion of the closed-cycle fluid path and arrives back at thermoelectric array 810 at a temperature $T_R$, thereby completing the closed cycle.

Figure 9:
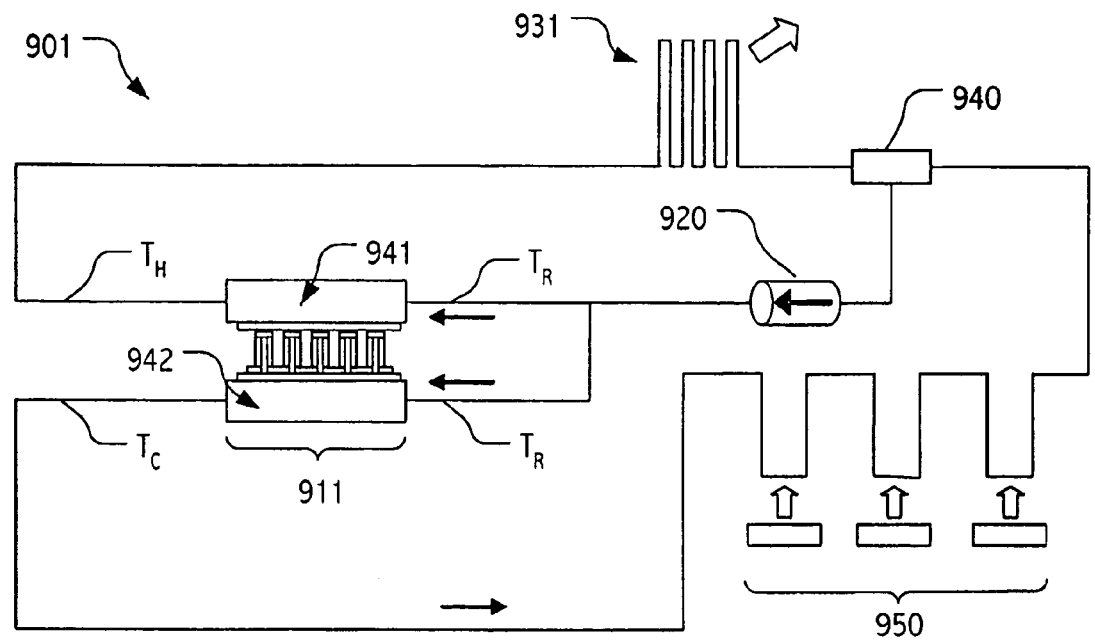
FIG. 9 depicts a thermoelectric cooler configuration in accordance with some embodiments of the present invention in which temporal integration of thermoelectric action is exploited.
Figure 11:
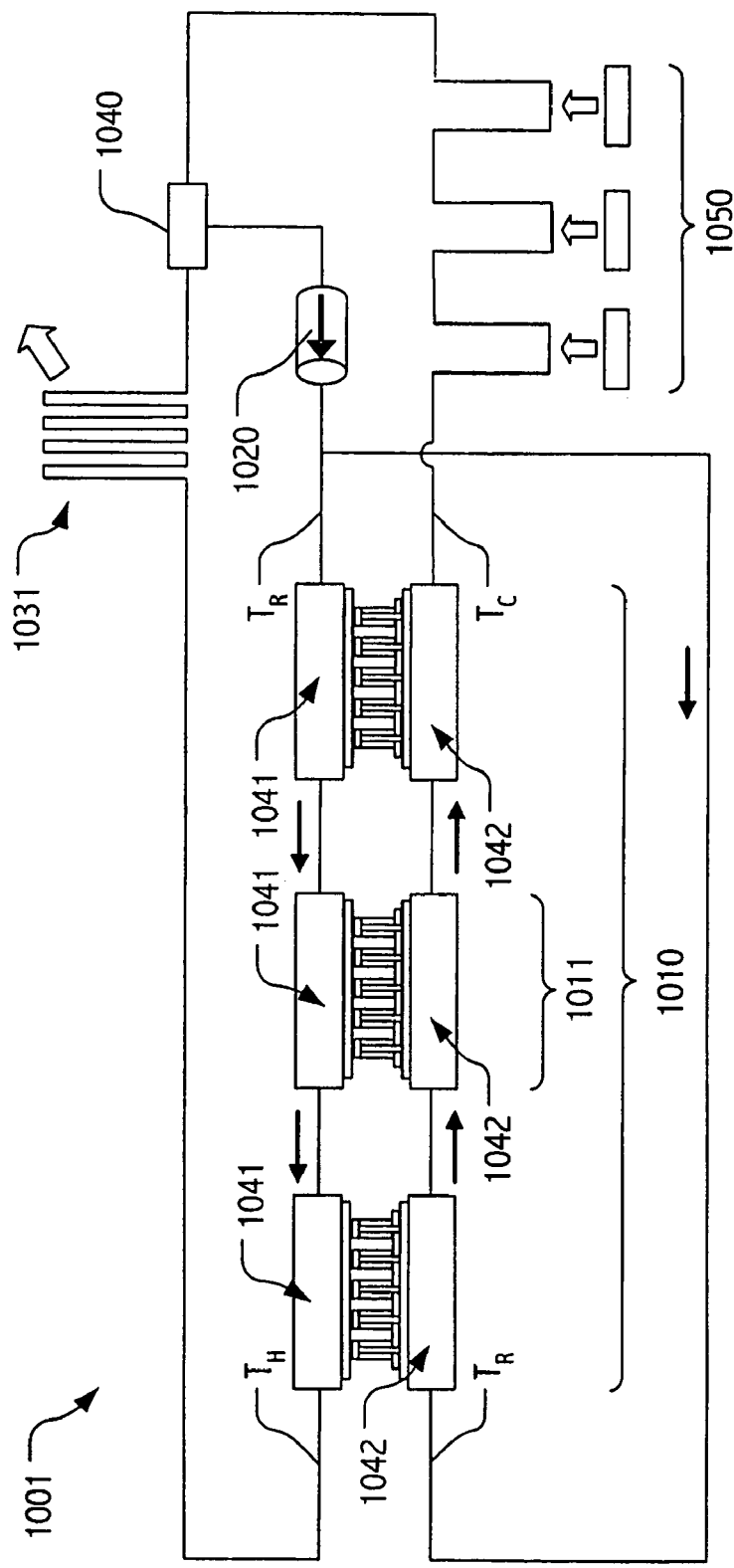
FIG. 11 depicts a counterflow thermoelectric cooler configuration in accordance with some embodiments of the present invention in which both temporal and spatial integration of thermoelectric action are exploited.

FIG. 9 depicts a thermoelectric cooler configuration 901 in which temporal integration of thermoelectric action is exploited. Forced fluid flow into heat exchanger reservoirs 941 and 942 is intermittent, introducing thermal transfer fluid of nominal temperature $T_R$ into respective reservoirs and allowing an amount thermal transfer fluid to dwell in therein and transfer heat from or to the respective hot or cold side of thermoelectric module 911. As before, thermal transfer fluid enters the portions of the closed cycle fluid pathway in communication with thermoelectric module 911 at a temperature $T_R$ and exits at $T_H$ or $T_C$. Integration of thermoelectric action of the single thermoelectric module 911 occurs over time (i.e., over the dwell time of thermal transfer fluid in respective reservoirs 941 and 942. Since only a single generally isothermal TE module is illustrated, counterflow is unnecessary and the illustrated flow topology has been simplified accordingly. In other configurations, such as illustrated in FIG. 11, counterflow may be desirable and can be provided.

While reservoirs 941 and 942 are illustrated as volumes into which substantial amounts of thermal transfer fluid may flow, persons of ordinary skill in the art will recognize, based on the description herein, that the capacity of any such reservoir is, in general, exploitation-dependent. Indeed, as a general matter, reservoirs 941 and 942 may be merely the portion of fluid pathway that makes thermal contact with the hot and cold sides of a thermoelectric module, respectively. In some configurations, reservoirs 941 and 942 may have the same cross-section as other portions of the respective fluid pathway, while they trace a serpentine, spiral, or labyrinthine path across the hot or cold side of the thermoelectric module, so as to increase the area of fluid pathway in thermal contact with the respective sides of the module. In some configurations, reservoirs 941 and 942 may have a larger cross-sectional area than another portion of the respective fluid pathway of which they form part, allowing flow through the reservoir portion to be slower than in another portion of the fluid pathway. In some configurations, reservoirs 941 and 942 may have the same cross-sectional area as other portions of the respective fluid pathway, with a different shape that allows for more efficient thermal transfer between the thermal transfer fluid in the reservoirs 941 and 942 and the respective sides of the thermoelectric module. Neither the cross-sectional area nor the shape of reservoirs 941 and 942 need be constant. In some configurations it may be advantageous to increase the cross-sectional area of the reservoirs 941 and 942 to reduce the propensity for turbulent flow in the fluid pathways.

Flows from the hot- and cold-side reservoirs 941 and 942 are eventually commingled in a recuperator (e.g., recuperator 940). As before, any of a variety of recuperators may be employed. For example, a simple pool recuperator may be employed in which thermal transfer fluid flows of dissimilar temperatures enter, conductive and/or convective heat transfer occurs, and one or more fluid flows exit at (or about) a recuperated mean temperature, $T_R$. Also as before, a simple commingling of flows of liquid metal thermal transfer fluid (e.g., without a distinct pool recuperator structure), may exchange heat adequately to achieve the desired recuperated ($T_R$) flow.

Figure 10:
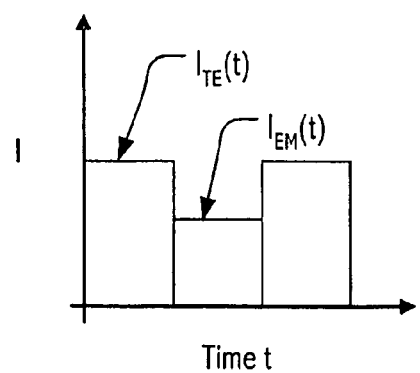
FIG. 10 depicts a power management technique in accordance with some embodiments of the present invention in which current demands of a thermoelectric and those of an electromagnetic pump appear in different intervals or phase.

As before, we assume that the thermal transfer fluid is a liquid metal or other conductive fluid or slurry and that pump 920 includes one or more electromagnetic pumps, such as a magnetofluiddynarnic pump described elsewhere herein. In the illustrated configuration, it can be desirable to at least partially synchronize operation of pump 920 with that of thermoelectric module 911. For example, in some realizations, instantaneous current demands can be reduced by driving thermoelectric module 911 and an electromagnetic pump realization of pump 920 in differing intervals or phases. FIG. 10 illustrates one such configuration or mode of operation in which thermoelectric current ($I_{TE}$) and pump current ($I_{EM}$) demands occur in alternating phases of operation.

Dwell duration and repetition rate of the flow/dwell cycle may be responsive to an operating characteristic of the thermoelectric system. For example, thermal transfer fluid in a hot side reservoir 941 may be allowed to dwell until the temperature of the fluid reaches a target value or a limit, after which flow is resumed, introducing a volume of thermal transfer fluid at the recuperated temperature $T_R$ into the reservoir and flowing thermal transfer fluid at the target temperature toward heat exchanger 931. Thermal transfer fluid in a cold side reservoir 942 may be allowed to dwell until the temperature of workpieces 950 reaches a trigger temperature or a limit value, at which time flow is resumed, transporting the thermal transfer fluid at $T_C$ toward the workpieces 950 to absorb heat generated by their operation. Similarly, either or both thermal transfer fluids may be allowed to dwell until the temperature differential ($\Delta T$) between the hot and cold sides of a thermoelectric module reaches a threshold value, above which efficiency of the module begins to deteriorate. In general such threshold values, or limits, are determined by the particular thermoelectric module and operating conditions such as heat load.

While dwelling in reservoirs 941 or 942, it is not necessary that the volume of thermal transfer fluid be completely motionless or that it completely cease its progress through the fluid pathways. When flow of the thermal transfer fluid is motivated by a pump, flow may continue for a time after the pump's operation has ceased due to momentum in the system. Nevertheless, flow will slow substantially, allowing for an increased amount of heat to be transferred between the thermoelectric module 911 and the volume of thermal transfer fluid dwelling in reservoirs 941 or 942.

In some configurations the thermoelectric module 911 is itself operated discontinuously. In general, operation of thermoelectric module 911 may be predetermined, or it may be adaptive, at least in part, to an operating characteristic of the thermoelectric system, such as the temperature of a workpiece, the temperature of a volume of thermal transfer fluid in a fluid pathway, the temperature of a side of a thermoelectric module (itself or another in the system), or the temperature differential ($\Delta T$) between the hot and cold sides of a thermoelectric module. Operation of thermoelectric module 911 may be substantially uncorrelated with flows of thermal transfer fluid through the hot-side fluid pathway, the cold-side fluid pathway, or both. Operation of thermoelectric module 911 may be substantially correlated with flows of thermal transfer fluid through the hot-side fluid pathway, the cold-side fluid pathway, or both. Pumps used to motivate the flow of thermal transfer fluid through fluid pathways in the system my operate in a phased relationship with thermoelectric module 911 so as to reduce the instantaneous current requirements of the system.

In some configurations dwell durations of the thermal transfer fluid in the reservoir, or reservoirs, may be predetermined, as in the case of periodic operation of an electromagnetic pump 920 that motivates the flow of the thermal transfer fluid. In some configurations, dwell durations of thermal transfer fluid in the hot side reservoir 941 may be the same as that of thermal transfer fluid in the cold side reservoir 942. In some configurations, particularly those such as depicted in FIGS. 6A and 6B, where different pumps 621 and 622 motivate flow through hot side and cold side fluid pathways, respectively, thermal transfer fluid may flow continuously through the fluid pathway, including the reservoir 941 or 942, on one side of the thermoelectric module 911, while flowing intermittently through the fluid pathway on the other side of the thermoelectric module, dwelling for a duration in the respective reservoir 942 or 941. In some configurations, dwell durations of thermal transfer fluid in the reservoir 941 or 942, on one side of the thermoelectric module 911 may be predetermined while the dwell durations of thermal transfer fluid in the other reservoir 942 or 941 may be responsive to an operating characteristic of the thermoelectric system, such as the temperature of a target, the temperature of a volume of thermal transfer fluid at some point in its pathway, or the temperature differential exhibited between the hot and cold sides of the thermoelectric module 911.

In configurations employing multiple electromagnetic pumps (see FIGS. 6A and 6B) it may be advantageous to operate only one pump at a time, limiting the instantaneous current demands of the system. Motivation of continuous flow of thermal transfer fluid in a fluid pathway can be accomplished by some configurations of multiple pumps each operated discontinuously. In some of these configurations, one pump may motivate the flow of commingled thermal transfer fluid intermittently, while an additional pump operating in a phase relationship with the first motivates the flow of thermal transfer fluid through only one fluid pathway, back toward a recuperator. It may be desirable in some configurations to operate multiple pumps in a phase relationship with each other and with a thermoelectric module in order to limit instantaneous current demands in the system.

In some configurations the operation of the thermoelectric module and any pumps may be arrested at the same time. For example, the operation of thermoelectric module 911 may be triggered by the temperature of workpieces 950. When a desired $T_C$ is reached, the operation of thermoelectric module 911 is arrested, and pump 920 is operated to flow the volume of thermal transfer fluid in cold side reservoir 942, now at $T_C$, toward the workpieces 950. The operation of pump 920 may be arrested while heat is transferred from the workpieces 950 to the thermal transfer fluid, so that neither the thermoelectric module 911 nor the pump 920 is operating. In configurations employing multiple pumps, the operation of all pumps may be arrested at the same time that the thermoelectric module 911 is at rest. In configurations employing multiple pumps, the operation of some pumps may be arrested at the same time that the thermoelectric module 911 is at rest, while other pumps operate continuously or in a phase relationship with the thermoelectric module 911.

To emphasize use of the temporal integration, a single TE module is illustrated in FIG. 9. However, more generally, both spatial and temporal integration of thermoelectric action may be exploited in some realizations. See e.g., the illustration of FIG. 11 in which both temporal and spatial integration of thermoelectric action are exploited.

FIG. 11 depicts a counterflow thermoelectric cooler configuration 1001 in which intermittent or discontinuous flows of thermal transfer fluid result in both temporal and spatial integration of thermoelectric action of thermoelectric array 1010 to cool targets 1050. The illustrated configuration is patterned after configuration previously described with reference to FIG. 8 in which hot-side and cold-side flows through a closed-cycle thermal transfer system a commingled. However, more generally, any of the previously illustrated counterflow loop configurations can be adapted (as now described) to incorporate temporal integration.

In the particular configuration illustrated in FIG. 11, a closed-cycle path for thermal transfer fluid flow splits to traverse both hot- and cold-sides of a thermoelectric array. Thermal transfer fluid of the hot side flow dwells momentarily at respective heat exchanger reservoirs (1041) and accumulates heat from hot-sides of respective thermoelectric modules 1011 and, after a dwell interval, flows toward heat exchanger 1031 and recuperator 1040. Similarly, thermal transfer fluid of the cold side flow dwells momentarily at respective heat exchanger reservoirs (1042) and releases heat to cold-sides of respective thermoelectric modules 1011. As with the preceding configuration, a single pump 1020 can suffice to motivate flow (intermittently or discontinuously) and may be operated such that thermoelectric current ($I_{TE}$) and pump current ($I_{EM}$) demands occur in alternating phases of operation. It may be desirable in some configurations to operate pump 1020 in a phase relationship with one or more stages of the thermoelectric array 1010 in order to limit instantaneous current demands in the system. Additionally, while a merged commingled flow of thermal transfer fluid configuration illustrated, persons of ordinary skill in the art will recognize that loop configurations akin to those presented in FIG. 6A (distinct hot-side and cold-side loops) and FIG. 8 (single closed-cycle loop traversing both hot- and cold-sides) may also be employed with intermittent or discontinuous fluid flow.

Topological Generalizations

While various thermoelectric array configurations have been illustrated with respect to linear arrangements that allow certain of the inventive concepts herein to be described with clarity, it will be apparent, based on the description herein, that a variety of topological generalizations may be applied to the linear arrangements illustrated. Two-dimensional arrays of thermoelectric modules are illustrative. In this regard, FIGS. 12-18 are plan view illustrations of a variety of two dimensional flow topologies that, like the linear arrangements previously illustrated, provide substantially uniform thermal differentials across respective array elements (or substantially isothermal groups thereof) during operation.

In describing these topological variations, we omit the loop configuration, heat exchanger, pump and recuperator details of the previously illustrated configurations, focusing instead on flow topologies in a small portion of the closed cycle fluid loop (or loops) of the thermoelectric system configurations described above with reference to FIGS. 6A, 7, 8, 9 and 11. In the illustrated two-dimensional portions of overall flow topologies, respective hot-side flows ($T_R$ to $T_H$) and cold-side flows ($T_R$ to $T_C$) are in thermal communication with thermoelectric modules of exemplary two-dimensional arrays thereof. Accordingly, based on the description herein of these two-dimensional topologies, persons of ordinary skill in the art will appreciate a variety of multidimensional thermoelectric array generalizations of the configurations previously illustrated.

Figure 12:
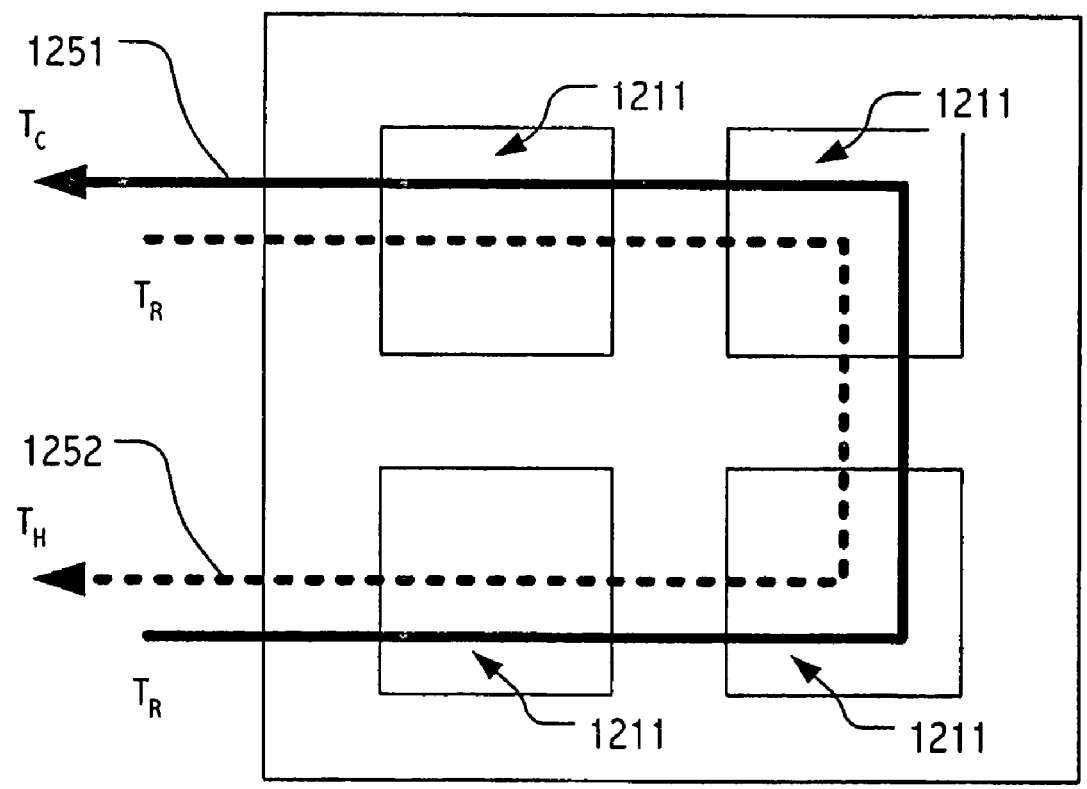
FIG. 12 illustrates a simple counterflow topology in a two-dimensional array of thermoelectric elements.

In some configurations (including linear configurations and two dimensional traversals such as illustrated in FIG. 12), counterdirectional fluid flows may be employed to achieve substantially uniform thermal differentials. In some configurations, other counterflow topologies (including crossflows) may be employed. Generally, an N-stage array or subarray may provide substantially uniform thermal differentials if counterflow topology is structured so that, at any particular thermoelectric module, the impinging hot-side and cold-side flows respectively traverse x and N−1−x stages {x: 0≦x<N} en route to the particular thermoelectric module.

FIG. 12 illustrates in a top-side plan view, a simple counterflow topology for a 2×2 array of thermoelectric modules. Cold-side flow 1251 and hot-side flow 1252 will be understood to be in thermal communication with respective cold-sides and hot-sides of thermoelectric modules 1211. As with the linear arrangements previously described, substantially uniform thermal differentials may be achieved across each of the illustrated thermoelectric modules 1211 based on the illustrated flow topology.

Figure 13:
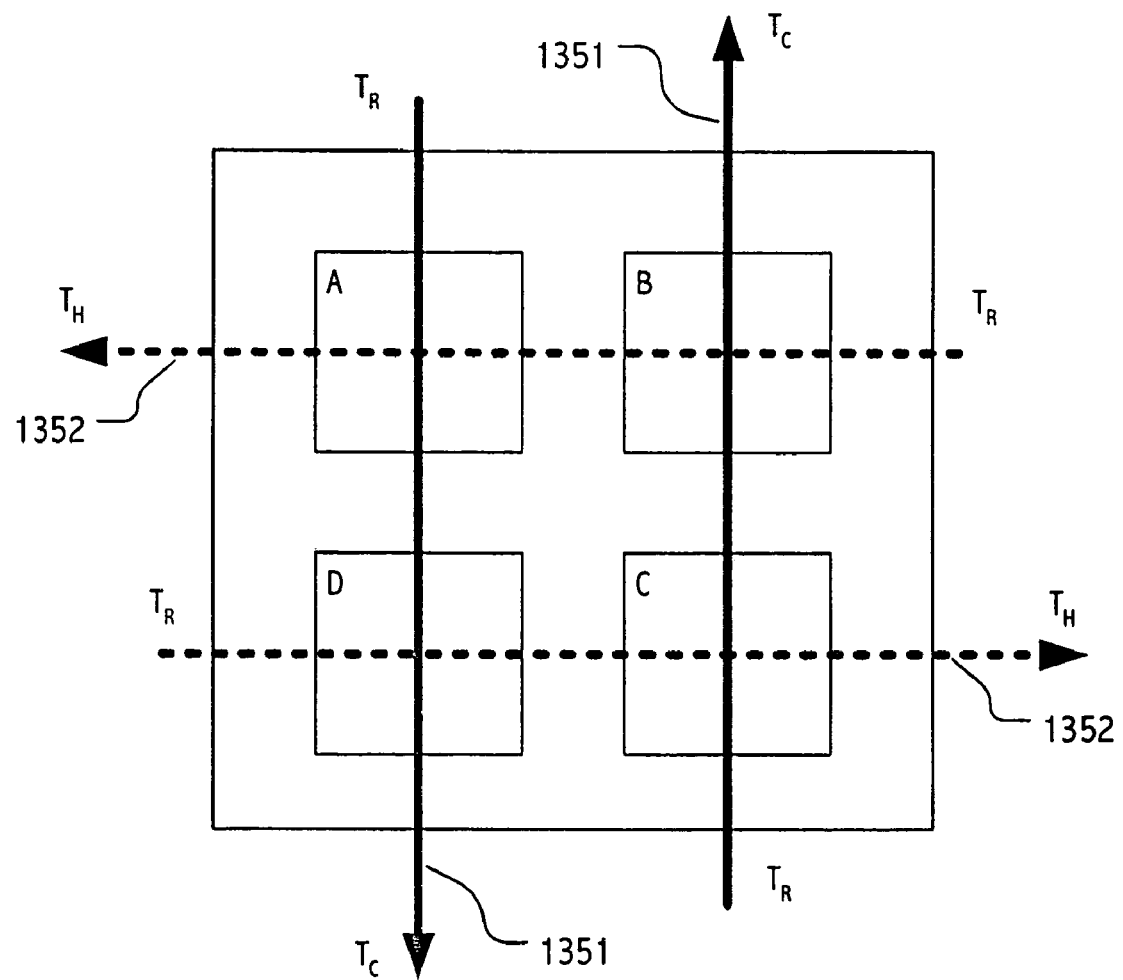
FIG. 13 illustrates another counterflow topology in a two-dimensional array of thermoelectric elements.

FIG. 13 illustrates in a top-side, plan view, another counterflow topology for a simple 2×2 array of thermoelectric elements. Cold-side flows 1351 and hot-side flows 1352 are in thermal communication with respective cold-sides and hot-sides of thermoelectric modules A, B, C and D. Substantially uniform thermal differentials can be achieved across each of the thermoelectric modules based on the illustrated flow topology.

Figure 14:
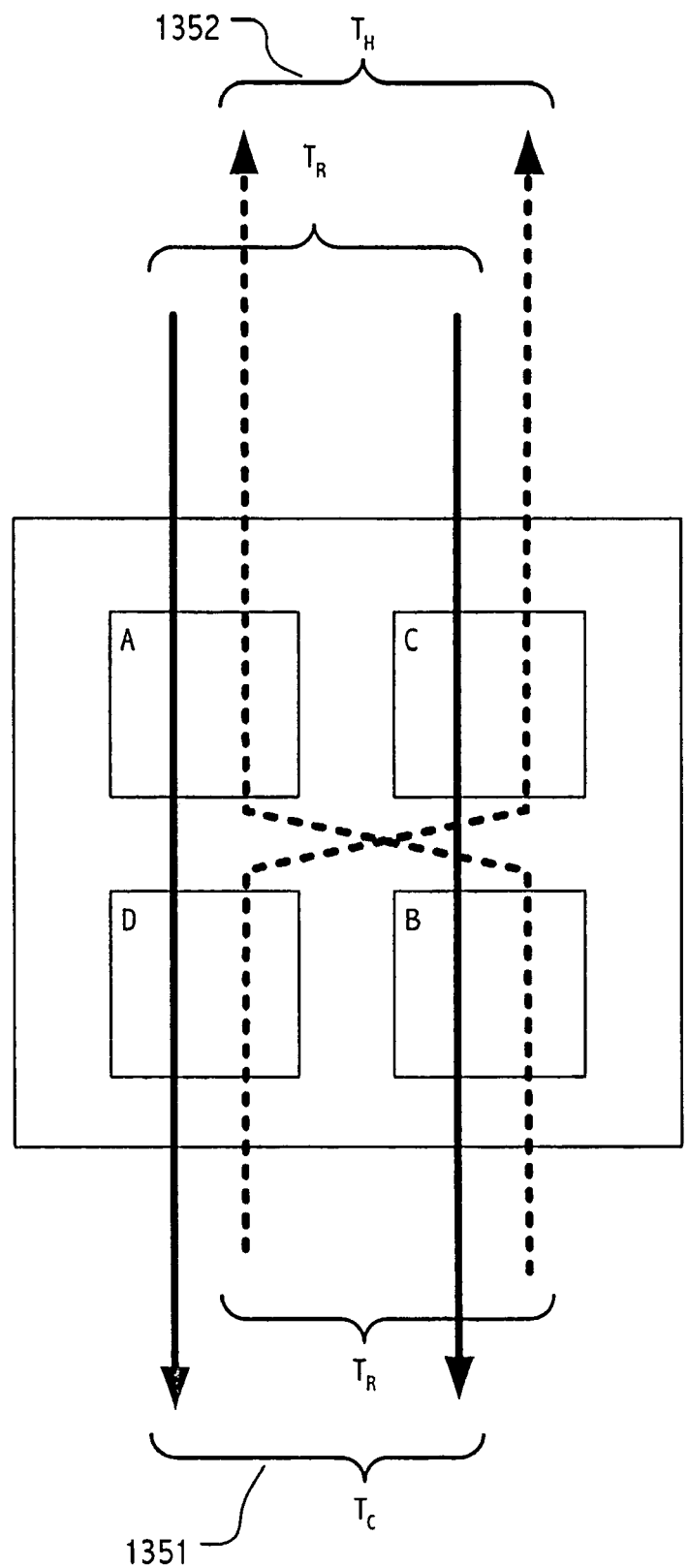
FIG. 14 illustrates still another counterflow topology in a two-dimensional array of thermoelectric elements.
Figure 15:
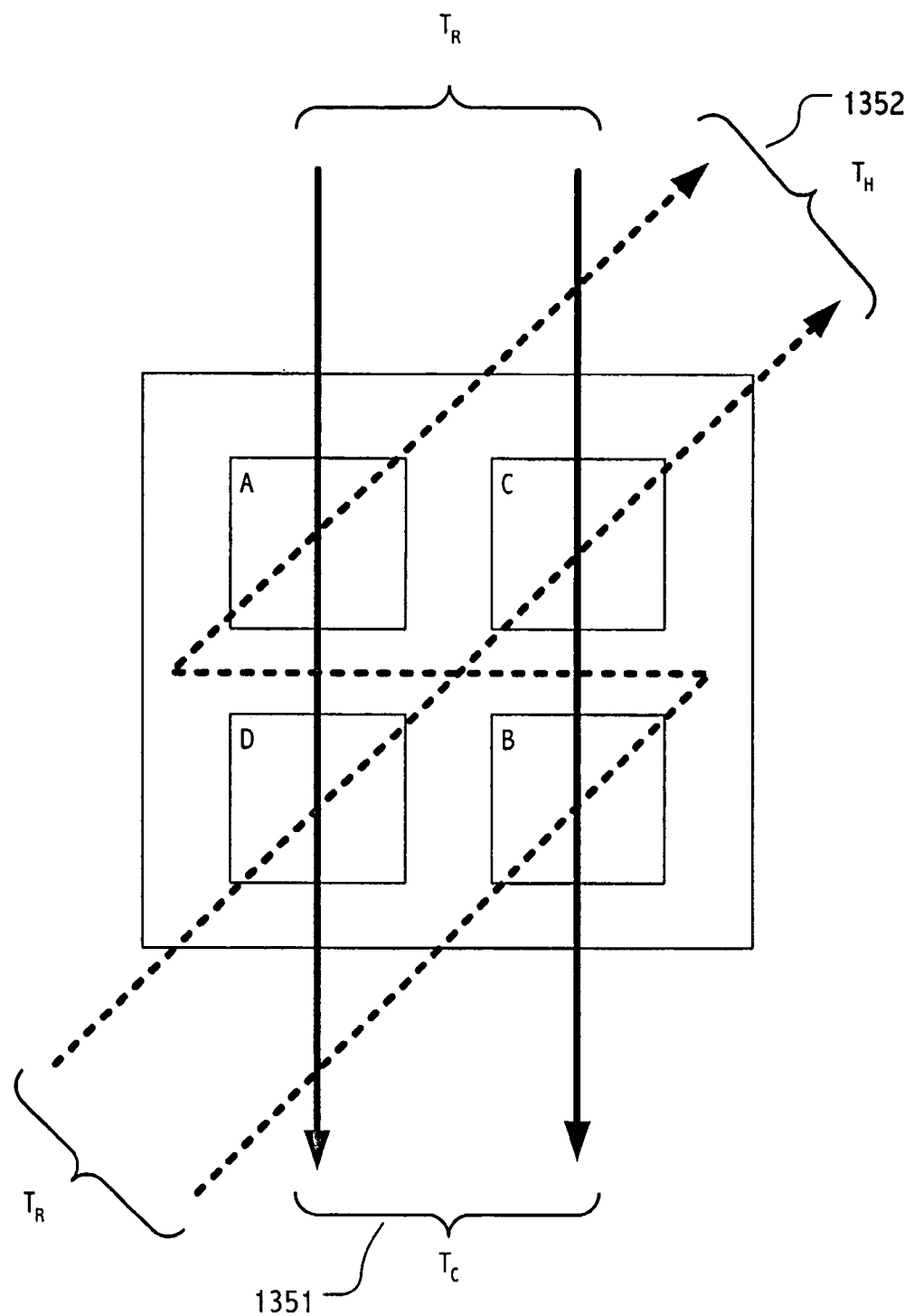

FIGS. 14 and 15 illustrates two topological transformations of the counterflows for the previously illustrated in FIG. 13. The transformations that allow inflows and outflows to be conveniently grouped for efficient routing in a larger system configuration. As before, cold-side flows 1351 and hot-side flows 1352 are in thermal communication with respective cold-sides and hot-sides of thermoelectric modules A, B, C and D.

Figure 16:
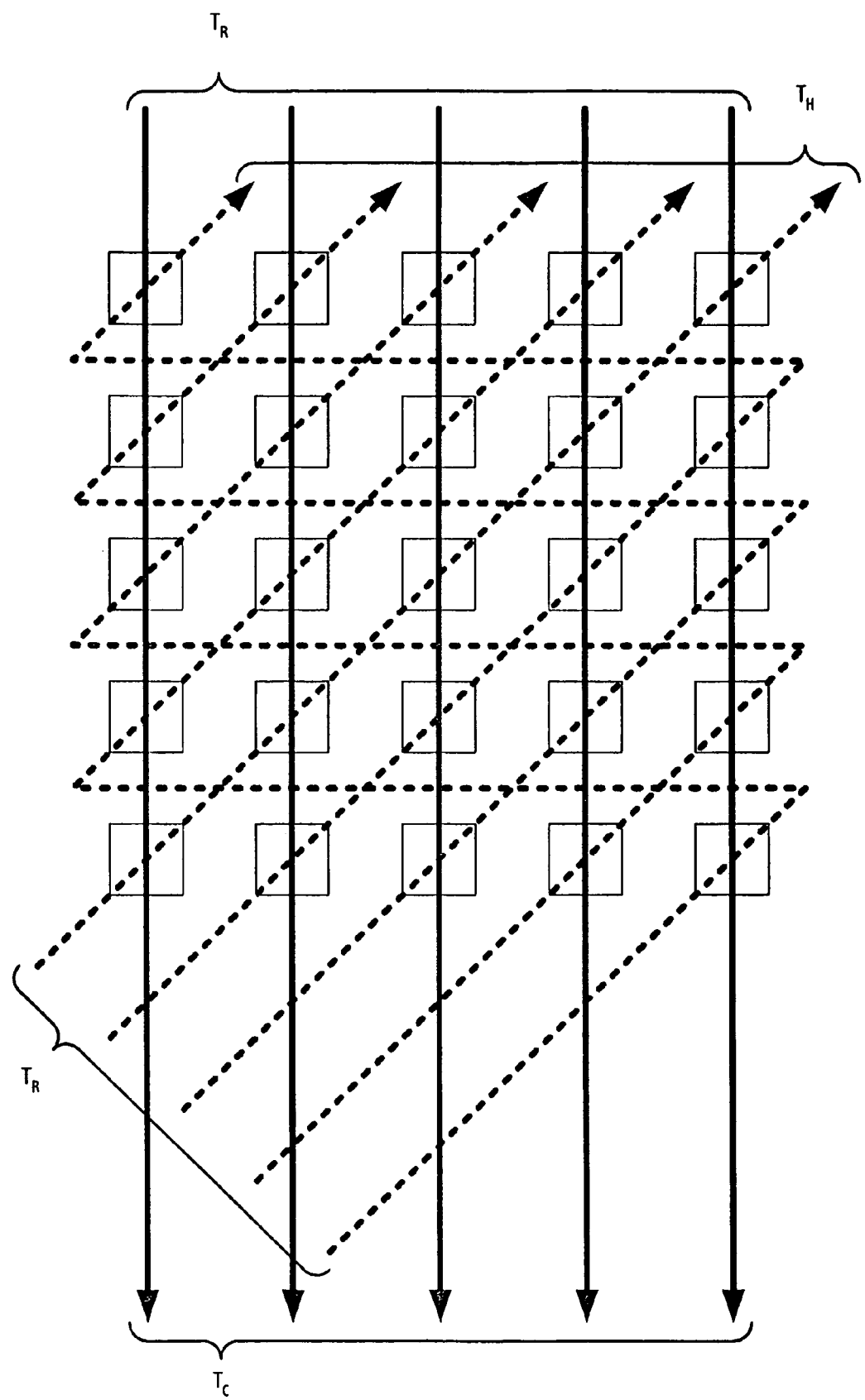
FIGS. 16, 17 and 18 generalize certain of the illustrated counterflow topologies to various n×n, n×m and m×n arrays of thermoelectric elements.
Figure 17:
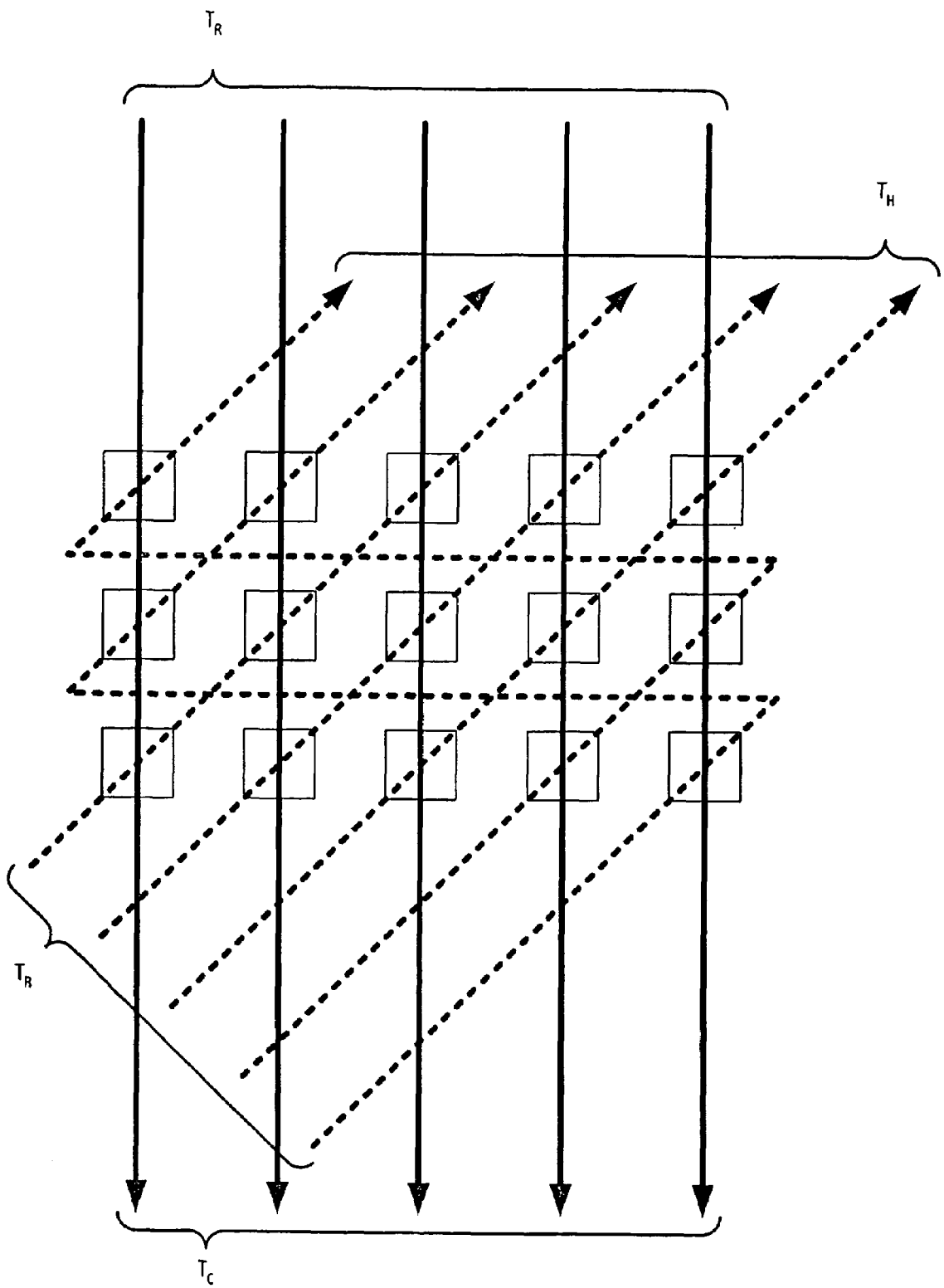
Figure 18:
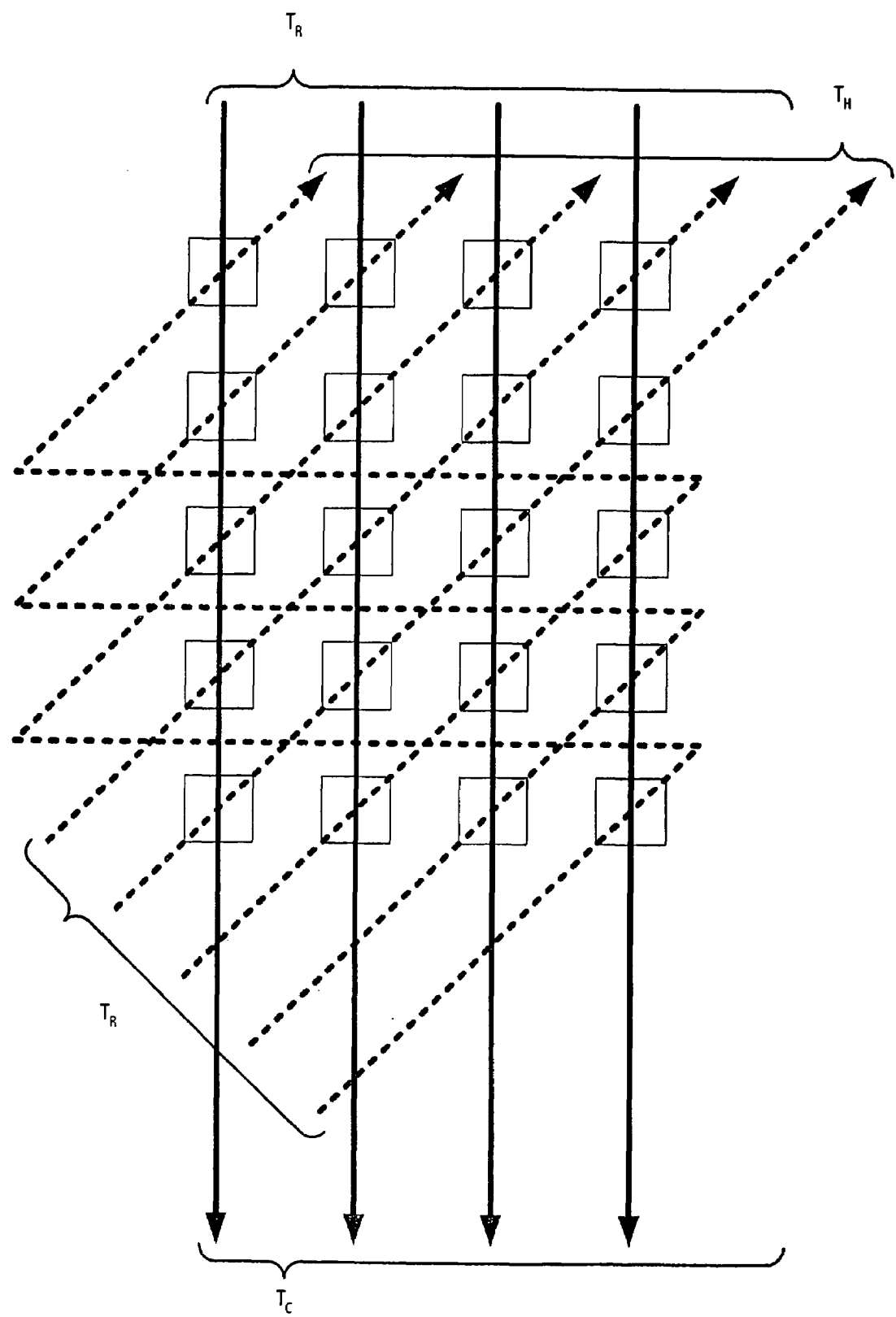

Finally, FIGS. 16, 17 and 18 generalize the previously illustrated counterflow topologies to larger arrays of thermoelectric elements. In particular, FIG. 16 generalizes the previously illustrated flow topology for a 2×2 array to that suitable for an n×n array. FIGS. 17 and 18 generalize the flow topology to that suitable for array without equal number of rows and columns.

OTHER EMBODIMENTS

While the invention(s) is(are) described with reference to various implementations and exploitations, it will be understood that these embodiments are illustrative and that the scope of the invention(s) is not limited to them. Many variations, modifications, additions, and improvements are possible.

For example, while operation of certain configurations has been described in the context of liquid metal thermal transfer fluids and magnetofluiddynamic (MFD) pump configurations, persons of ordinary skill in the art will recognize that alterative thermal transfer fluids including conductive thermal transfer fluids (useful with MFD pump configurations) and non-conductive thermal transfer fluids and other pump configurations (MFD, electromagnetic or otherwise) may be employed. While the descriptions of various embodiments of the of the invention(s) have referred to thermal transfer fluids as a single phase, for clarity of description, it may be advantageous in some configurations to employ thermal transfer fluids comprising multiple phases. For example, immiscible liquids may be used as thermal transfer fluid. In particular, mixtures of water and non-reactive liquid metals, or of dry gas (e.g. Ar or N) and liquid metals, may be used as thermal transfer fluid. These immiscible mixtures may be advantageously deployed, for example, when it is desirable to limit thermal conduction within the fluid pathway(s).

Thermoelectric array configurations have been described with reference to counterflow topologies; however, it will be apparent that counterflow topologies are unnecessary in configurations that employ a single thermoelectric element or module and, more generally, may be omitted in certain array configurations, if desired. Similarly, persons of ordinary skill in the art will recognize, based on the description herein, that recuperation techniques may be unnecessary in certain configurations, and may be omitted, if desired and appropriate.

Although many of the illustrated configurations are described in the context of a high power density device (HPDD) cooling configuration, it will be apparent that other recuperated fluid cycle thermoelectric heat transfer configurations (including cooling, heating, cooling/heating, thermal regulation, etc.) are all contemplated and that HPDD applications are for illustration only. In general, suitable cooling and/or heating targets are varied and may include targets that are neither dense nor thermal sources. In particular, exploitations of the described thermoelectric systems can include air conditioning and refrigeration.

Furthermore, persons of ordinary skill in the art will appreciate that terms such as cold, colder, hot, hotter and the like are relative terms and do not imply any particular temperature, temperature range or relation to any particular ambient or quiescent temperature. While loop configurations have been described without regard flow to any particular flow timings, rates or the like, persons of ordinary skill in the art will appreciate suitable adaptations for particular thermal loads and heat transfer characteristics of particular heat exchangers and/or thermal transfer fluids employed in a given exploitation.

A variety of alternate placements of components (including pumps, heat exchangers, recuperators, etc.) and thermoelectric module designs are consistent with the preceding description and claims that follow. In particular, thermoelectric modules may include one or more thermoelectric elements.(or couples) in a substantially isothermal configuration. The term "thermoelectric" (e.g., thermoelectric module, couple, element, device, material etc.) is meant in the broadest sense of the term in which thermal potential is traded for electromagnetic potential (or vice versa), and therefore includes those thermoelectric configurations which exploit Peltier or Seebeck effects, as well as those that operate based upon Thomson, quantum tunneling, thermoionic, magneto caloric or other similar effect or combination of effects. Additionally, while some configurations have been described primarily with reference to continuous unidirectional flow of thermal transfer fluids, it will be understood that continuous, semi-continuous, unidirectional, substantially unidirectional, variable direction, variable flow rate, intermittent and/or pulsed flows may employed in some realizations without departing from the spirit and scope of the invention(s).

Certain materials or material systems are commonly employed in configurations that exploit particular thermoelectric-type effects. In general, appropriate material selections are based on the particular thermoelectric-type effects exploited and may be optimized for operating temperatures, compatibility with other materials and other factors.

More generally, plural instances may be provided for components, operations or structures described herein as a single instance. Finally, boundaries between various components and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the invention(s).

What is claimed is:

1. A method of operating a thermoelectric system for thermal control of a target, the method comprising:
   flowing a first volume of thermal transfer fluid into a portion of a first fluid pathway, the first portion in thermal communication with a first side of a thermoelectric module;
   allowing at least a some of the first volume to dwell in the first fluid pathway portion;
   flowing a second volume of thermal transfer fluid into the first fluid pathway portion, while at the same time, flowing at least some of the first volume out toward the target; and
   repeating, for the second and subsequent volumes of the thermal transfer fluid, the allowing to dwell and the flowing toward the target.

2. The apparatus of claim 1,
   wherein duration of the dwell is selected allow heat transfer between the first side of the thermoelectric module and the thermal transfer fluid while limiting the temperature differential between the first and a second side of the thermoelectric module.

3. The method of claim 1, further comprising:
   discontinuously operating at least one electromagnetic (EM) pump to flow the thermal transfer fluid.

4. The method of claim 1,
   wherein duration of each dwell is pre-selected.

5. The method of claim 1,
   wherein duration of any given dwell is adaptive, at least in part, to an operating characteristic of the thermoelectric system.

6. The method of claim 1,
   wherein the thermoelectric module operates during at least some time during which the thermal transfer fluid dwells in the first fluid pathway portion.

7. The method of claim 1,
   wherein the thermoelectric module operates during at least some time during which the thermal transfer fluid flows in the first fluid pathway portion.

8. The method of claim 1,
   wherein the thermoelectric module operates substantially continuously.

9. The method of claim 1,
   wherein operation of the thermoelectric module and the repeating exhibit a phase relationship.

10. The method of claim 1, further comprising
    flowing a thermal transfer fluid in a second fluid pathway portion in thermal communication with the second side of the thermoelectric module.

11. The method of claim 10, wherein the flow in the second fluid pathway portion is one of:
    continuous;
    substantially temporally aligned with the flow in the first fluid pathway portion;

substantially uncorrelated with the flow in the first fluid pathway portion; and discontinuous.

12. The method of claim 10, the method further comprising:
allowing at least a portion of a third volume of thermal transfer fluid to dwell in the second fluid pathway portion;
flowing a fourth volume of thermal transfer fluid into the second fluid pathway portion, while at the same time flowing at least a portion of the third volume of thermal transfer fluid out toward a heat exchanger; and
repeating, for the fourth and subsequent volumes of the thermal transfer fluid, the allowing to dwell and the flowing toward the heat exchanger.

13. A method of operating a thermoelectric system, the method comprising:
discontinuously motivating flow of a first thermal transfer fluid through a first fluid pathway portion in thermal communication with a first side of a thermoelectric module;
operating the thermoelectric module such that a temperature differential exists between the first and a second side of the thermoelectric module; and
transferring heat between the first side of the thermoelectric module and a first volume of thermal transfer fluid in thermal communication therewith.

14. The method of claim 13,
wherein the discontinuous motivation of flow is by discontinuous operation of at least one magnetofluiddynamic (MFD) pump.

15. The method of claim 14,
wherein operation of the pump is periodic.

16. The method of claim 14,
wherein temporal behavior of the pump is at least partially responsive to an operating characteristic of the thermoelectric system.

17. The method of claim 16, wherein the operating characteristic of the thermoelectric system includes one or more of:
a temperature differential between the first and second sides of the thermoelectric module; and
a temperature of thermal transfer fluid.

18. The method of claim 14, wherein the operation of the thermoelectric module is itself one of:
continuous;
substantially temporally aligned with operation of the pump;
substantially uncorrelated with operation of the pump; and
discontinuous.

19. The method of claim 14,
wherein the operation of the thermoelectric module and the operation of the pump are substantially non-overlapping.

20. The method of claim 14,
wherein the operation of the thermoelectric module and the operation of the pump are arrested during an overlapping interval.

21. The method of claim 13, further comprising:
motivating flow of a second thermal transfer fluid through a second fluid pathway portion in thermal communication with a second side of the thermoelectric module.

22. The method of claim 21, wherein thermal transfer fluid flow through the second fluid pathway portion is itself:
continuous;
substantially temporally aligned with flow through the first fluid pathway portion;
substantially uncorrelated with flow through the first fluid pathway portion; and
discontinuous.

23. The method of claim 21,
wherein the first and second fluid pathway portions constitute distinct first and second closed fluid loops.

24. The method of claim 21,
wherein the second closed fluid loop is partially overlapped with the first closed fluid loop; and
wherein the first and second thermal transfer fluids are a same fluid.

25. The method of claim 21,
wherein the first and second fluid pathway portions constitute respective portions of a single closed fluid loop; and
wherein the first and second thermal transfer fluids are a same fluid.

26. A thermoelectric system comprising:
at least one thermoelectric module that exhibits, during operation, a thermal differential between a first and second side thereof;
a first fluid pathway including a first portion in thermal communication with a first side of the thermoelectric module; and
a pump operable to discontinuously motivate flow of thermal transfer fluid through the first fluid pathway, wherein the discontinuous motivation flows a first volume of thermal transfer fluid into the first fluid pathway portion and flows a corresponding second volume of the thermal transfer fluid out of the first fluid pathway portion.

27. The thermoelectric system of claim 26,
wherein the operation of the thermoelectric module is continuous.

28. The thermoelectric system of claim 26,
wherein the operation of the thermoelectric module is discontinuous.

29. The thermoelectric system of claim 26, further comprising:
a second fluid pathway including a second portion in thermal communication with a second side of the thermoelectric module.

30. The thermoelectric system of claim 26, further comprising:
the thermal transfer fluid disposed within the first fluid pathway.

31. The thermoelectric system of claim 30,
wherein the thermal transfer fluid includes a liquid metal.

32. The thermoelectric system of claim 30,
wherein the thermal transfer fluid includes an electrically conductive fluid or slurry.

33. The thermoelectric system of claim 30,
wherein the thermal transfer fluid includes a mixture of immiscible fluids.

34. The thermoelectric system of claim 29, further comprising:
two distinct closed fluid loops for transfer of the thermal transfer fluid away from, and back to, the thermoelectric module,
the first closed fluid loop including the first fluid pathway, and
the second closed fluid loop including the second fluid pathway.

35. The thermoelectric system of claim 29, further comprising:
a single closed loop in thermal communication with both the first and second sides of the thermoelectric module, the single closed fluid loop including both the first and the second fluid pathways; and wherein the pump is a single electromagnetic pump disposed within the single closed loop to motivate flow of the thermal transfer fluid through both the first and second fluid pathways.

36. The thermoelectric system of claim 29, further comprising:

two at least partially overlapped closed fluid loops for transfer of the thermal transfer fluid away from, and back to, the thermoelectric module, the first closed fluid loop including the first fluid pathway, and the second closed fluid loop including the second fluid pathway, wherein thermal transfer fluid from the first and second closed fluid loops is commingled at at least one point in the overlapped closed fluid loops; and at least one electromagnetic pump disposed in an overlapped portion of the overlapped closed fluid loops.

37. The thermoelectric system of claim 29, at least one additional thermoelectric module, each thermoelectric module constituting a stage of a thermoelectric array, wherein the flow topology traverses N-stages of the thermoelectric array, and wherein the flow topology is structured so that, at any particular one of the thermoelectric modules, impinging hot-side and cold-side flows respectively traverse x and N−1−x stages {x: 0≦x<N} en route to the particular thermoelectric module.

38. The thermoelectric system of claim 26, configured to:

cool a heat source or target;

heat a target; or at least partially regulate temperature of a heat source or target.

39. An apparatus comprising:

at least one thermoelectric module that exhibits, during operation, a thermal differential between a first and second side thereof;

a first fluid pathway including a portion thereof in thermal communication with a first side of the thermoelectric module; and means for discontinuously motivating a thermal transfer fluid through the first fluid pathway portion and temporally integrating heat transfer between the thermal transfer fluid and the thermoelectric module.

* * * * *